(12) United States Patent
Fung

(10) Patent No.: US 10,769,326 B2
(45) Date of Patent: *Sep. 8, 2020

(54) PARALLEL SOLUTION FOR FULLY-COUPLED FULLY-IMPLICIT WELLBORE MODELING IN RESERVOIR SIMULATION

(71) Applicant: Saudi Arabian Oil Company, Dhahran (SA)

(72) Inventor: Larry Siu-Kuen Fung, Dhahran (SA)

(73) Assignee: Saudi Arabian Oil Company, Dhahran (SA)

(*) Notice: Subject to any disclaimer, the term of this patent is extended or adjusted under 35 U.S.C. 154(b) by 104 days.

This patent is subject to a terminal disclaimer.

(21) Appl. No.: 16/263,689

(22) Filed: Jan. 31, 2019

(65) Prior Publication Data

US 2019/0163855 A1    May 30, 2019

Related U.S. Application Data

(63) Continuation of application No. 14/948,605, filed on Nov. 23, 2015, now Pat. No. 10,242,136.

(60) Provisional application No. 62/164,083, filed on May 20, 2015.

(51) Int. Cl.
| | | |
|---|---|---|
| *G06G 7/48* | (2006.01) | |
| *G06F 30/30* | (2020.01) | |
| *E21B 43/00* | (2006.01) | |
| *G06F 17/16* | (2006.01) | |
| *E21B 41/00* | (2006.01) | |

(52) U.S. Cl.
CPC .......... *G06F 30/30* (2020.01); *E21B 41/0092* (2013.01); *E21B 43/00* (2013.01); *G06F 17/16* (2013.01)

(58) Field of Classification Search
None
See application file for complete search history.

(56) References Cited

U.S. PATENT DOCUMENTS

| 5,321,612 A | 6/1994 | Stewart | |
|---|---|---|---|
| 5,604,911 A * | 2/1997 | Ushiro | G06F 17/12 703/2 |
| 7,516,056 B2 | 4/2009 | Wallis et al. | |

(Continued)

OTHER PUBLICATIONS

Byer et al., "Preconditioned Newton Methods for Fully Coupled Reservoir and Surface Facility Models", SPE Annual Technical Conference and Exhibition, 1998, pp. 181-188, Society of Petroleum Engineers.

(Continued)

*Primary Examiner* — Rehana Perveen
*Assistant Examiner* — Nithya J. Moll
(74) *Attorney, Agent, or Firm* — Bracewell LLP; Constance G. Rhebergen; Christopher L. Drymalla

(57) ABSTRACT

Computer processing time and results are improved in fully-coupled fully-implicit well-reservoir simulation system using Jacobian matrix methodology. Approximate inverse preconditioners are provided which treat a well influence matrix at comparable accuracy and robustness to those for the grid-to-grid flow terms of system matrix. The methodology is highly parallelizable and the data processing can be performed faster, as fewer solver iterations are required to converge to the same acceptable tolerances.

1 Claim, 13 Drawing Sheets

(56) References Cited

U.S. PATENT DOCUMENTS

| | | | |
|---|---|---|---|
| 7,596,480 | B2 | 9/2009 | Fung et al. |
| 8,190,405 | B2 | 5/2012 | Appleyard |
| 8,386,227 | B2 | 2/2013 | Fung et al. |
| 8,433,551 | B2 | 4/2013 | Fung et al. |
| 8,463,586 | B2 | 6/2013 | Mezghani et al. |
| 8,583,411 | B2 | 11/2013 | Fung |
| 8,775,144 | B2 | 7/2014 | Han et al. |
| 8,977,524 | B2 * | 3/2015 | Legbedji ............... G06Q 10/04 703/2 |
| 9,753,180 | B2 | 9/2017 | Suzuki |
| 2006/0235667 | A1 | 10/2006 | Fung et al. |
| 2007/0255779 | A1 | 11/2007 | Watts, III |
| 2010/0082509 | A1 | 4/2010 | Mishev et al. |
| 2010/0082724 | A1 | 4/2010 | Diyankov et al. |
| 2010/0217574 | A1 | 8/2010 | Usadi et al. |
| 2011/0098998 | A1 | 4/2011 | Lunati et al. |
| 2011/0191080 | A1 | 8/2011 | Klie |
| 2012/0022841 | A1 | 1/2012 | Appleyard |
| 2013/0211800 | A1 | 8/2013 | Fung |
| 2014/0114636 | A1 * | 4/2014 | Daloukas .............. G06F 30/367 703/14 |

OTHER PUBLICATIONS

Coats et al., "A Generalized Wellbore and Surface Facility Model, Fully Coupled to a Reservoir Simulator", Reservoir Evaluation & Engineering, 2004, pp. 132-142, Society of Petroleum Engineers.

Dogru et al., "A Next Generation Parallel Reservoir Simulator for Giant Reservoir", SPE Reservoir Simulation Symposium, 2009, pp. 1-29, SPE 119272.

European Extended Search Report dated Sep. 26, 2018 for corresponding European Patent Application No. 18178356.4 (SA5651/EP); pp. 1-7.

Fung et al., "A Fully-Implicit Fully-Coupled Well Model for Parallel Mega-Cell Reservoir", Technical Symposium of Saudi Arabia, 2005, pp. 1-10, Society of Petroleum Engineers.

Fung et al., "Parallel Unstructured-Solver Methods for Simulation of Complex Giant Reservoir", Reservoir Simulation Symposium, 2007, pp. 440-446, SPE 106237.

Fung et al., "Unconstrained Voronoi Grids for Densely Spaced Complex Wells in Full-Field Reservoir Simulation", SPE Journal, 2014, pp. 803-815, Society of Petroleum Engineers.

Holmes et al., "A Unified Wellbore Model for Reservoir Simulation", Technical Conference and Exhibition, 2010, pp. 1-14, Society of Petroleum Engineers.

Holmes et al., "Application of a Multisegment Well Model to Simulate Flow in Advanced Wells", European Petroleum Conference, 1998, pp. 171-181, Society of Petroleum Engineers.

Holmes, "Enhancements to the Strongly Coupled, Fully Implicit Well Model: Wellbore Crossflow Modeling and Collective Well Control", Reservoir Simulation Symposium, 1983, pp. 255-266, Society of Petroleum Engineers of AIME.

International Search Report and Written Opinion for related PCT application PCT/US2016/032819 (SA5370/PCT) dated Oct. 14, 2016; pp. 1-18.

Jiang et al.,"Scalable Multi-stage Linear Solver for Coupled Systems of Multi-segment Wells and Complex Reservoir Models", SPE Reservoir Simulation Symposium, 2009, pp. 1-10, Society of Petroleum Engineers.

Partial International Search Report for related PCT application PCT/US2016/032819 (SA5370/PCT) dated Aug. 10, 2016; pp. 1-10.

Wallis et al., "Constrained Residual Acceleration of Conjugate Residual Methods", SPE Reservoir Simulation Symposium, 1985, pp. 415-428, SPE 13536.

* cited by examiner

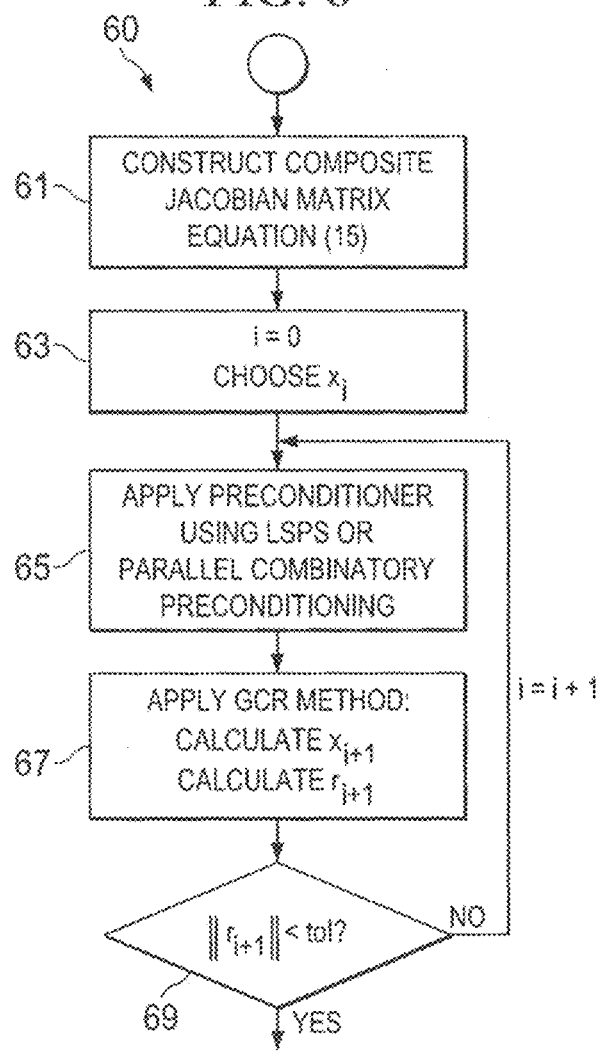

PARALLEL SOLUTION FOR FULLY-COUPLED FULLY-IMPLICIT WELLBORE MODELING IN RESERVOIR SIMULATION

CROSS REFERENCE TO RELATED APPLICATIONS

This application is a continuation of U.S. patent application Ser. No. 14/948,605 filed Nov. 23, 2015 and which claims priority to U.S. Provisional Patent Application No. 62/164,083 filed May 20, 2015, which are hereby incorporated by reference.

BACKGROUND OF THE INVENTION

1. Field of the Invention

The present invention relates to computerized simulation of hydrocarbon reservoirs, and in particular to simulation of wellbore flow in reservoirs with complex multi-lateral wells tightly coupled with thousands of reservoir grid cells in a large high resolution reservoir simulation model.

2. Description of the Related Art

Reservoir simulation is widely used in the petroleum industry to analyze by computerized processing the performance of subsurface hydrocarbon reservoirs and to manage and optimize production from such reservoirs. One type of reservoir simulation is what is known as fully-coupled full-implicit well-reservoir simulation. Presently, most wells drilled are multilateral horizontal wells with long reach to increase reservoir contact. At the same time, finer grid reservoir simulation model are used to enhance the fidelity of recovery process analysis and better optimize and plan future reservoir management operations. As a result, it is not uncommon to have a multi-lateral well penetrating several thousand grid cells.

To properly model the physics of flow in and around the wellbore, the well may also be segmented to represent in detail the flow physics inside the wellbore. This in turns leads to more accurate boundary condition for the inflow performance calculation for fluids flow into and out of a well cell.

So far as is known, current art computerized fully-coupled fully-implicit reservoir simulators have used what are known as the Rowsum or Colsum approximations in the construction of the preconditioning step of the iterative solver of the simulator. This is because earlier methods than the Rowsum or Colsum approximations used either pre-elimination of the well equations using the reservoir equations, or direct application of a preconditioning method on the composite matrix with both the well and reservoir equations. However, these earlier methods were only suitable if the numbers of grid cells penetrated by the wells were small.

Otherwise, the numbers of fill terms in the solution matrices of the earlier methods became too large and impractical. The earlier solver methods also in a number of cases were too complex to implement because the well equations and reservoir equations sets had different characteristics and difficulties. At the same time, the number of algebraic equations per well segment was typically different from the number of equations per reservoir grid cell. This complicated the solver book-keeping of processor node assignment and reservoir and well cell data distribution, and also reduced code complexity, impact on solution algorithm, as well as code efficiency.

The Rowsum or Colsum methods which came into use to replace earlier methods to account for the well influence matrix were simple to implement and were, as noted, typically used in current reservoir simulators. Unfortunately, this method was weak, and lacked the required robustness for the complex problems where a long-reach multilateral well might in normal cases penetrate thousands of grid cells. This was particularly true for a highly heterogeneous reservoir modeled with fine grids, and when the well might be cross-flowing, meaning that some of the well perforations may have fluid inflow into the wellbore while some other perforations may have backflow from the wellbore into the reservoir.

SUMMARY OF THE INVENTION

Briefly, the present invention provides a new and improved computer implemented method of simulating the flow of the multiphase flow of fluids in computerized reservoir simulation of flow of such multiphase fluids in wellbores of multilateral wells which have flow interchange at a plurality of locations along the extent of their lengths in the reservoir with cells of a subterranean hydrocarbon reservoir organized into a grid of reservoir cells based on input reservoir data, with the reservoir cells having multiphase fluid flow taking place therein. The computer implemented method partitions the reservoir into a plurality of reservoir grid cells in a grid formed of a number of contiguous grid cells; and partitions the multilateral wellbores into a plurality of wellbore cells in a grid formed of a number of contiguous wellbore cells along the lengths of the wellbores. Representations of state changes and pressures within the reservoir grid cells and flow interchange with the wellbore cells at locations of flow interchange with the wellbore cells are established. Representations of the flow interchange with the wellbore cells and flow interchange with the reservoir grid cells at locations of flow interchange with the reservoir grid cells are established for the wellbore cells. A series preconditioner is formed as a series based expansion by matrix-vector multiplication operations of well influence terms based on the established representations of flow interchange with the wellbore cells for the reservoir grid cells and the established representations of flow interchange with the reservoir grid cells for wellbore cells having flow interchange. A conjugate residual interactive matrix solution is applied in the computer to solve the representations of flow of the multiphase fluids in the reservoir grid cells and wellbore cells and obtain a residual. The steps of forming a series preconditioner by matrix-vector multiplication operations and applying a conjugate residual interactive matrix solution in the computer to solve for the representations of flow of the multiphase fluids of the wellbore cells are repeated until the obtained residual is within an established limit of accuracy. The computerized simulation of representations of flow of the multiphase fluids of the wellbore cells when the obtained residual is within the established limit of accuracy are stored, and an output display is formed of the stored computerized simulation of representations of flow of the multiphase fluids of the wellbore in the reservoir.

The present invention also provides a new and improved data processing system for computerized simulation of flow of multiphase fluids in wellbores of multilateral wells which have flow interchange at a plurality of locations along the extent of their lengths in the reservoir with cells of a subterranean hydrocarbon reservoir organized into a grid of reservoir cells based on input reservoir data, the reservoir cells having multiphase fluid flow taking place therein. The data processing system includes a processor which partitions the reservoir into a plurality of reservoir grid cells in a grid formed of a number of contiguous grid cells, and partitions the multilateral wellbores into a plurality of wellbore cells in a grid formed of a number of contiguous wellbore cells along the lengths of the wellbores. The processor also establishes for the reservoir grid cells representations of state changes and pressures within the reservoir grid cells and flow interchange with the wellbore cells at locations of flow interchange with the wellbore cells. The processor also establishes for the wellbore cells representations of the flow interchange with the wellbore cells and flow interchange with the reservoir grid cells at locations of flow interchange with the reservoir grid cells. The processor then forms a series preconditioner as a series based expansion by matrix-vector multiplication operations of well influence terms based on the established representations of flow interchange with the wellbore cells for the reservoir grid cells and the established representations of flow interchange with the reservoir grid cells for wellbore cells having flow interchange. The processor applies a conjugate residual interactive matrix solution in the computer to solve the representations of flow of the multiphase fluids in the reservoir grid cells and wellbore cells to obtain a residual. The processor then repeats the steps of forming a series preconditioner by matrix-vector multiplication operations and applying a conjugate residual interactive matrix solution in the computer to solve for the representations of flow of the multiphase fluids of the wellbore cells until the obtained residual is within an established limit of accuracy. The data processing system also includes memory storing the computerized simulation of representations of flow of the multiphase fluids of the wellbore cells when the obtained residual is within the established limit of accuracy, and a display which displays the stored computerized simulation of representations of flow of the multiphase fluids of the wellbore cells of the reservoir.

The present invention also provides a new and improved data storage device which has stored in a non-transitory computer readable medium computer operable instructions for causing a data processor to simulate flow of multiphase fluids in wellbores of multilateral wells which have flow interchange at a plurality of locations along the extent of their lengths in the reservoir with cells of a subterranean hydrocarbon reservoir organized into a grid of reservoir cells based on input reservoir data. The stored instructions cause the processor to partition the reservoir into a plurality of reservoir grid cells in a grid formed of a number of contiguous grid cells; and to partition the multilateral wellbores into a plurality of wellbore cells in a grid formed of a number of contiguous wellbore cells along the lengths of the wellbores. The stored instructions cause the processor to establish for the reservoir grid cells representations of state changes and pressures within the reservoir grid cells and flow interchange with the wellbore cells at locations of flow interchange with the wellbore cells, and to establish for the wellbore cells representations of the flow interchange with the wellbore cells and flow interchange with the reservoir grid cells at locations of flow interchange with the reservoir grid cells. The stored instructions also cause the processor to form a series preconditioner as a series based expansion by matrix-vector multiplication operations of well influence terms based on the established representations of flow interchange with the wellbore cells for the reservoir grid cells and the established representations of flow interchange with the reservoir grid cells for wellbore cells having flow interchange. The stored instructions cause the processor to apply a conjugate residual interactive matrix solution in the computer to solve the representations of flow of the multiphase fluids in the reservoir grid cells and wellbore cells to obtain a residual. The stored instructions cause the processor to repeat the steps of forming a series preconditioner by matrix-vector multiplication operations and applying a conjugate residual interactive matrix solution in the computer to solve for the representations of flow of the multiphase fluids of the wellbore cells until the obtained residual is within an established limit of accuracy. The stored instructions the cause the processor to store the computerized simulation of representations of flow of the multiphase fluids of the wellbore cells when the obtained residual is within the established limit of accuracy, and to form an output display of the stored computerized simulation of representations of flow of the multiphase fluids of the wellbore in the reservoir.

The present invention also provides a new and improved computer implemented method of simulation of flow of multiphase fluid in wellbores of multilateral wells in a subsurface hydrocarbon reservoir, the multilateral wells having interchange of fluids at a plurality of locations along the extent of their lengths in the reservoir with cells of a subterranean reservoir organized into a grid of reservoir cells based on input reservoir data, the reservoir cells having multiphase fluid flow taking place therein. The computer implemented method organizes in the computer a fully coupled nonlinear set of implicit reservoir equations with reservoir data, pressure equations and flow equations for reservoir cells having flow interchange with certain ones of the multilateral wells into a reservoir computation matrix, a vector of reservoir and fluid flow unknowns and a vector of reservoir residuals; and also organizes in the computer a fully coupled nonlinear set of implicit well equations with well data and flow equations for wellbore cells having flow interchange with certain ones of the reservoir cells into a wellbore computation matrix, a vector of fluid flow unknowns and a vector of wellbore residuals. The computer implemented method also organizes in the computer a well influence matrix based on the flow interchange of the wellbore cells and the reservoir cells, as well as a full system computation matrix comprising the reservoir computation matrix and the wellbore computation matrix, a vector of full system unknowns and a vector of full system residuals. The computer implemented method extracts pressure coefficients of the reservoir computation matrix and the wellbore computation matrix, and extracts pressure residuals from the full system residuals. The computer implemented then solves an approximate pressure solution for pressures within the reservoir and wellbore cells of the full system computation matrix by minimizing the extracted pressure residuals, and updates fluid pressures and the residuals for the reservoir cells of the full system computation matrix based on the approximate pressure solution. The computer implemented method then calculates an approximate full system update for the full system computation matrix, the well influence matrix and the updated pressures and residuals. The computer implemented method then combines the approximate full system update with the updated fluid pressures, updates the full system residuals and determines the multiphase fluid flow by solving the full system computation matrix using the fully coupled nonlinear set of conservation equations and the updated system residuals.

The present invention also provides a new and improved data processing system for simulation of simulation of flow of multiphase fluid in wellbores of multilateral wells in a subsurface hydrocarbon reservoir, the multilateral wells having interchange of fluids at a plurality of locations along the extent of their lengths in the reservoir with cells of a subterranean reservoir organized into a grid of reservoir cells based on input reservoir data, the reservoir cells having multiphase fluid flow taking place therein. The data processing system includes a processor which organizes in the computer a fully coupled nonlinear set of implicit reservoir equations with reservoir data, pressure equations and flow equations for reservoir cells having flow interchange with certain ones of the multilateral wells into a reservoir computation matrix, a vector of reservoir and fluid flow unknowns and a vector of reservoir residuals. The processor also organizes in the computer a fully coupled nonlinear set of implicit well equations with well data and flow equations for wellbore cells having flow interchange with certain ones of the reservoir cells into a wellbore computation matrix, a vector of fluid flow unknowns and a vector of wellbore residuals. The processor then organizes in the computer a well influence matrix based on the flow interchange of the wellbore cells and the reservoir cells, and a full system computation matrix formed of the reservoir computation matrix and the wellbore computation matrix, a vector of full system unknowns and a vector of full system residual. The processor extracts pressure coefficients of the reservoir computation matrix and the wellbore computation matrix, and also extracts pressure residuals from the full system residuals. The processor then solves an approximate pressure solution for pressures within the reservoir and wellbore cells of the full system computation matrix by minimizing the extracted pressure residuals. The processor then updates the fluid pressures and the residuals for the reservoir cells of the full system computation matrix based on the approximate pressure solution. The processor calculates an approximate full system update for the full system computation matrix, the well influence matrix and the updated pressures and residuals, and combines the approximate full system update with the updated fluid pressures, and updates the full system residuals. The processor then determines the multiphase fluid flow by solving the full system computation matrix using the fully coupled nonlinear set of conservation equations and the updated system residuals.

The present invention further provides a new and improved data processing system for simulation of simulation of flow of multiphase fluid in wellbores of multilateral wells in a subsurface hydrocarbon reservoir, the multilateral wells having interchange of fluids at a plurality of locations along the extent of their lengths in the reservoir with cells of a subterranean reservoir organized into a grid of reservoir cells based on input reservoir data, the reservoir cells having multiphase fluid flow taking place therein. The data processing system includes a processor which organizes in the computer a fully coupled nonlinear set of implicit reservoir equations with reservoir data, pressure equations and flow equations for reservoir cells having flow interchange with certain ones of the multilateral wells into a reservoir computation matrix, a vector of reservoir and fluid flow unknowns and a vector of reservoir residuals. The processor also organizes in the computer a fully coupled nonlinear set of implicit well equations with well data and flow equations for wellbore cells having flow interchange with certain ones of the reservoir cells into a wellbore computation matrix, a vector of fluid flow unknowns and a vector of wellbore residuals. The processor also organizes in the computer a well influence matrix based on the flow interchange of the wellbore cells and the reservoir cells, and organizes in the computer a full system computation matrix composed of the reservoir computation matrix and the wellbore computation matrix, a vector of full system unknowns and a vector of full system residuals. The processor extracts pressure coefficients of the reservoir computation matrix and the wellbore computation matrix, and then extracts pressure residuals from the full system residuals. The processor then solves for an approximate pressure solution for pressures within the reservoir and wellbore cells of the full system computation matrix by minimizing the extracted pressure residuals. The processor then updates the fluid pressures and the residuals for the reservoir cells of the full system computation matrix based on the approximate pressure solution. The processor then calculates an approximate full system update for the full system computation matrix, the well influence matrix and the updated pressures and residuals. The processor combines the approximate full system update with the updated fluid pressures, updates the full system residuals and determines the multiphase fluid flow by solving the full system computation matrix using the fully coupled nonlinear set of conservation equations and the updated system residuals.

The present invention further provides a new and improved data storage device having stored in a non-transitory computer readable medium computer operable instructions for causing a processor to simulate flow of multiphase fluid in wellbores of multilateral wells in a subsurface hydrocarbon reservoir, the multilateral wells having interchange of fluids at a plurality of locations along the extent of their lengths in the reservoir with cells of a subterranean reservoir organized into a grid of reservoir cells based on input reservoir data, the reservoir cells having multiphase fluid flow taking place therein. The instructions stored in the data storage device causing the processor to organize in the computer a fully coupled nonlinear set of implicit reservoir equations with reservoir data, pressure equations and flow equations for reservoir cells having flow interchange with certain ones of the multilateral wells into a reservoir computation matrix, a vector of reservoir and fluid flow unknowns and a vector of reservoir residuals. The stored instructions also cause the processor to organize in the computer a fully coupled nonlinear set of implicit well equations with well data and flow equations for wellbore cells having flow interchange with certain ones of the reservoir cells into a wellbore computation matrix, a vector of fluid flow unknowns and a vector of wellbore residuals. The stored instructions further cause the processor to organize in the computer a well influence matrix based on the flow interchange of the wellbore cells and the reservoir cells, and then organize in the computer a full system computation matrix comprising the reservoir computation matrix and the wellbore computation matrix, a vector of full system unknowns and a vector of full system residuals. The instructions cause the processor to extract pressure coefficients of the reservoir computation matrix and the wellbore computation matrix, and extract pressure residuals from the full system residuals. The instructions then cause the processor to solve an approximate pressure solution for pressures within the reservoir and wellbore cells of the full system computation matrix by minimizing the extracted pressure residuals. The instructions cause the processor to then update fluid pressures and the residuals for the reservoir cells of the full system computation matrix based on the approximate pressure solution, and calculate an approximate full system update for the full system computation matrix, the well influence matrix and the updated pressures and residuals. The instructions cause the processor to combine the approximate full system update with the updated fluid pressures, and updating the full system residuals. The instructions then cause the processor to determine the multiphase fluid flow by solving the full system computation matrix using the fully coupled nonlinear set of conservation equations and the updated system residuals.

BRIEF DESCRIPTION OF THE DRAWINGS

FIG. 6 is a functional block diagram or flow chart of data processing steps for fully-coupled fully-implicit wellbore modeling in reservoir simulation according to certain embodiments of the present invention.

DETAILED DESCRIPTION OF THE PREFERRED EMBODIMENTS

Reservoir Simulator

As an introduction, a more detailed description of known computerized reservoir simulation of the types identified above is provided. For the recovery of oil and gas from subterranean reservoirs, wellbores are drilled into these formations for the recovery of hydrocarbon fluid. During the recovery process, fluids such as water and/or gas are injected into the injector wells and the fluid mixture in the pore space is produced from the producer wells. In order to predict the future performance of these reservoirs and to evaluate alternative development plan, reservoir simulators are used to run simulation models. These models are first calibrated with a history matching step using existing production data. The calibrated models are then used to evaluate future operation scenarios. For example, the history-matched models may be used to determine when and where to drill additional wells in order to recover more of the remaining hydrocarbon in place.

The reservoir simulator is a computer-implemented software methodology which solves a system of discrete balance equations for each grid block. The discrete equations are typically formed from a finite-volume discretization of the governing system of non-nonlinear partial differential equations describing the mass, momentum, and energy conservation equations within the reservoir.

Figure 1:
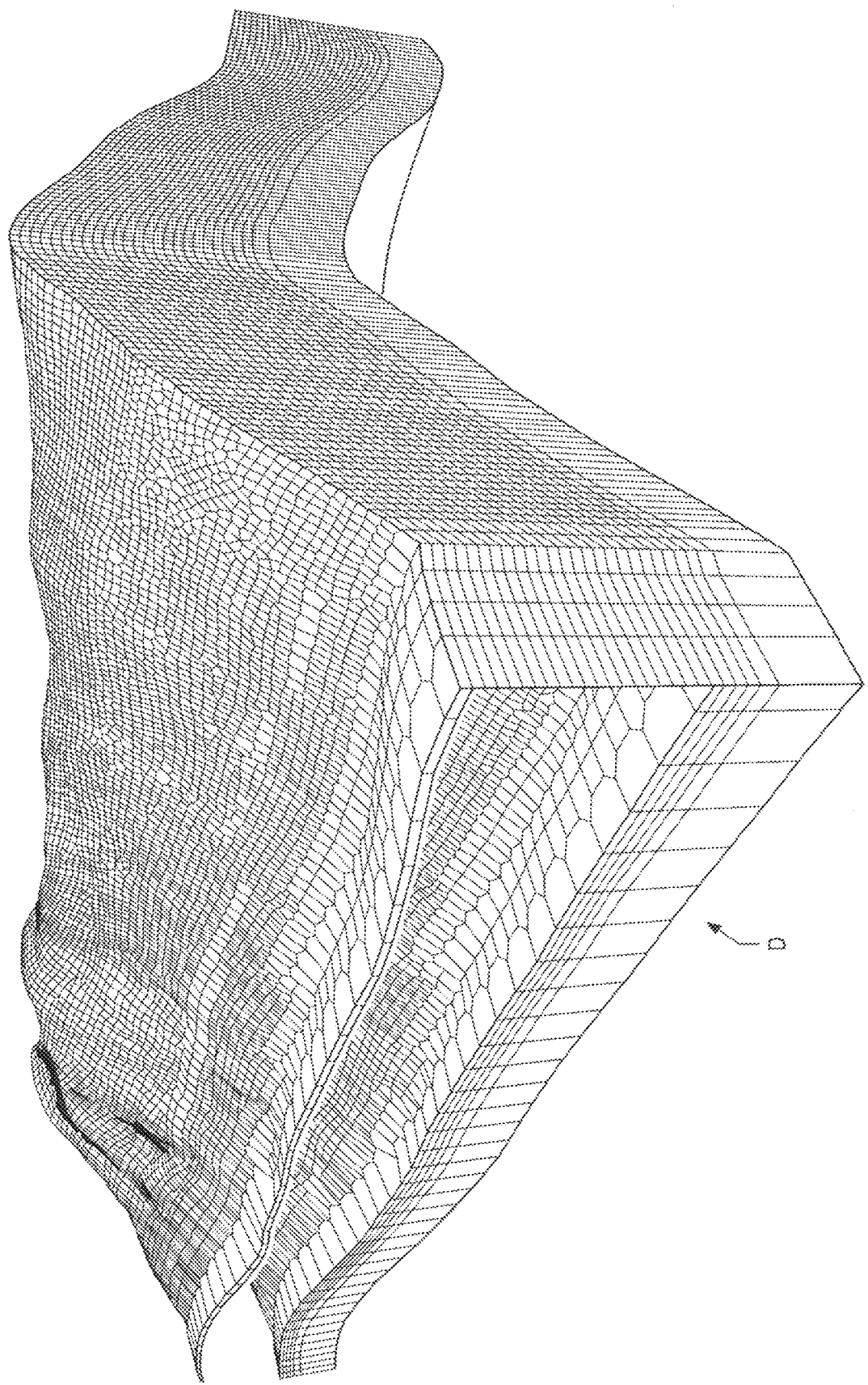
FIG. 1 is an isometric view of a computerized model of a subsurface reservoir structured grid.
Figure 2:
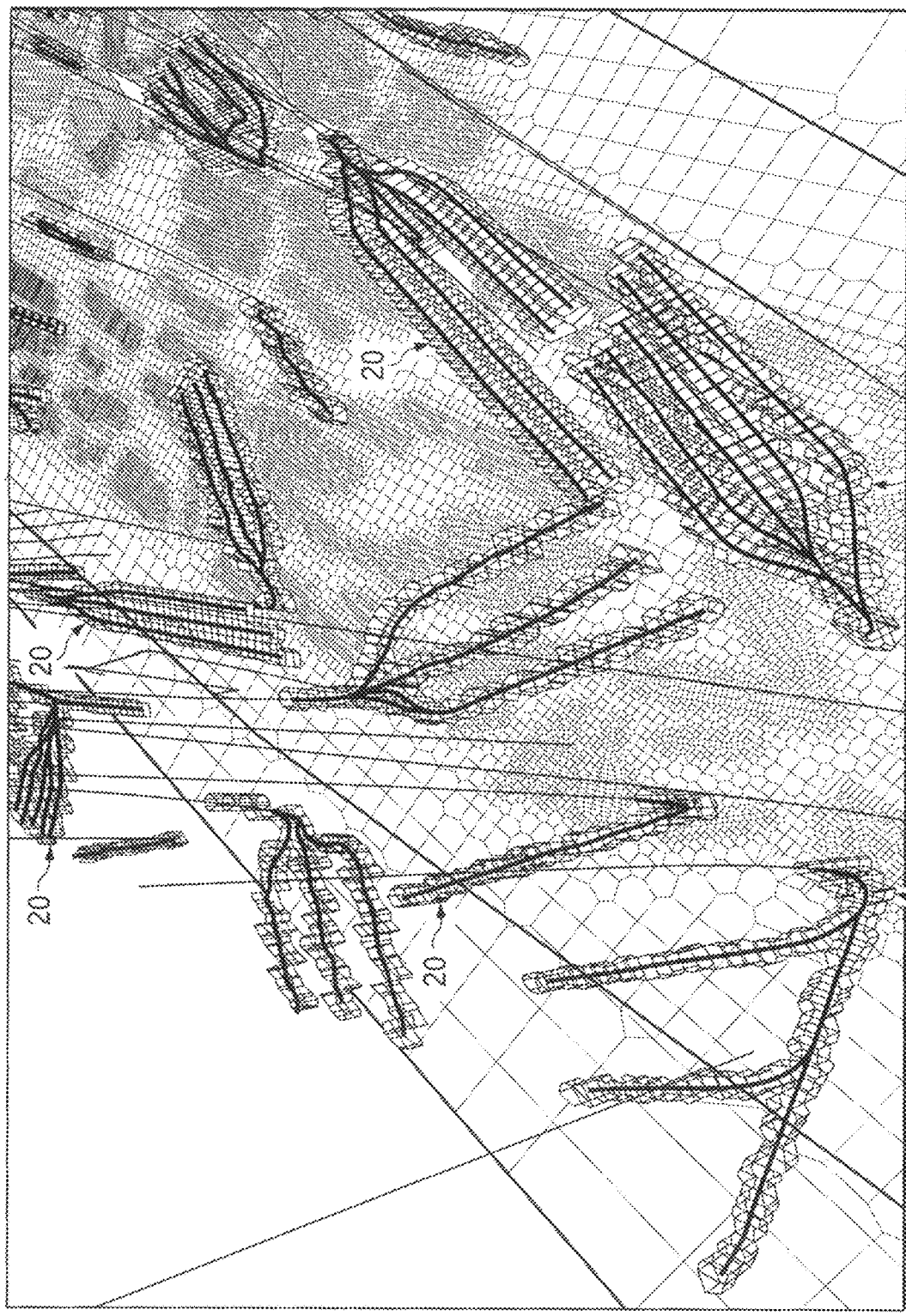
FIG. 2 is an image of a three dimensional view of a several multi-lateral wells and the penetrated grid blocks in a reservoir simulation model.
Figure 3:
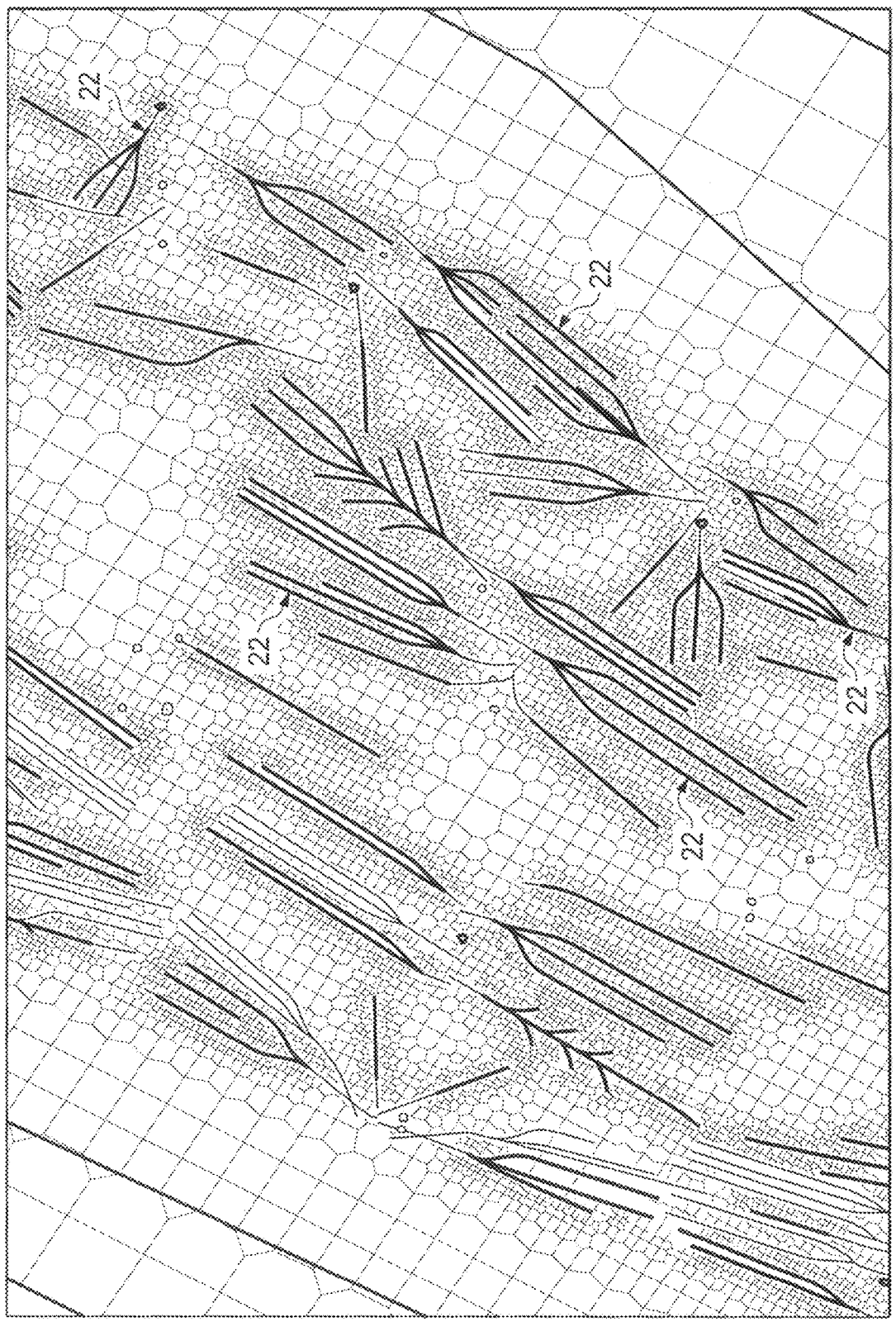
FIG. 3 is a plan view of several multi-lateral wellbores traversing finite-volume grid blocks in a reservoir model.

FIG. 1 illustrates a typical reservoir simulation domain D discretized into millions of finite volumes. Wells are drilled into the reservoir formation to inject or produce fluids into or from its pore space. FIG. 2 illustrates a 3D-view of several multi-branch complex wells 20 penetrating many grid blocks within a reservoir model M and FIG. 3 illustrates a 2D plan view of a reservoir model M-1 with many multilateral wells 22.

The well equations which represent the imposed constraints, either the injecting or producing fluid phase rates, or the well bottom-hole-pressure, and sometimes also include the mass, momentum, and energy balance within the wellbore itself of wells such as shown at 20 and 22. The system, including the wells and the reservoir, represents a tightly coupled highly nonlinear system where the derivatives can be discontinuous locally making it difficult to solve. For robustness and numerical stability, implicit methods are generally applied to solve the coupled system of equations. Since the well flow terms represent the dominant boundary conditions, a robust implicit scheme for the strongly coupled system between wells and reservoir is usually highly desirable. Thus, what is known as the fully-coupled fully-implicit method is the predominant current methodology for the treatment of wells in reservoir simulation. However, due to its complexity, the coupled well-reservoir solution method is handled in some approximate way during the solution process. The present invention provides methodology to address these shortcomings.

The background description of Saudi-Aramco's Giga-POWERS reservoir simulator can be found in Dogru et al. (SPE119272, "A Next-Generation Parallel Reservoir Simulator for Giant Reservoirs," Proceedings of the SPE Reservoir Simulation Symposium, The Woodlands, Tex., USA, 2-4 Feb. 2009, 29 pp.) The transient solution of the multiphase multicomponent system involves the evolution of mass and energy conservation in a sequence of time steps from the initial condition of the reservoir. For each time step, the system of nonlinear discrete equations for each finite volume is linearized using what is known as the generalized Newton's method.

Nomenclature

The symbols in the equations to be set forth below have the following meanings:

p=pressure
q=production rate
$x_i$=Mole fraction
$V_j$=Phase Volume
$S_j$=Phase Saturation
$c_i$=Overall Concentration of species i
$\phi$=porosity
$\rho$=density μ=viscosity
ω=mass fraction
R=Homogeneous reaction rate
D=Dispersion Coefficient
u=velocity
$V_i$=Rock pore volume
$n_i^t$=Overall number of mole
Superscripts:
ref=reference
p=a fluid phase
t=total
Subscripts:
i=component index
j=phase index

Species Conservation

A general species conservation equation for a species component i is given by:

$$\frac{\partial c_i}{\partial t} + \nabla \cdot \sum_{j=1}^{n_p} (\rho_j \omega_{ij} u_j - \phi \rho_j S_j \vec{D}_{ij} \cdot \nabla \omega_{ij}) = \phi \sum_{j=1}^{n_p} (S_j R_{ij}) + (1-\phi) R_{is} + \dot{q}_i \quad (1)$$

Where $$c_i = \phi \sum_{j=1}^{n_p} \rho_j \omega_{ij} S_j + (1-\phi) \rho_s \omega_{is} \quad (2)$$

If dispersion, chemical reaction and absorption are ignored, the species equation simplifies to $$\frac{1}{V_b} \frac{\partial n_i^t}{\partial t} + \nabla \cdot \sum_{j=1}^{n_p} (\rho_j x_{ij} u_j) = \dot{q}_i \quad (3)$$

Since the pore space of porous medium must be filled with fluids present, the pore volume must be equal to the total fluid volume. This can be expressed as:

$$\sum_{j=1}^{n_p} V_j = V_\phi \quad (4)$$

Where the pore volume, $V_\phi$, is a function of pressure alone and described as:

$$V_\phi = V_\phi^{ref} e^{C_r(P^{ref}-P)} \quad (5)$$

Pressure and the overall number of moles are the primary variables. For closure, the other equations used are:

$$\sum_{i=1}^{n_c} x_{ij} = 1 \quad (6)$$

$$\sum_{j=1}^{n_p} n_j^p x_{ij} = n_i^t \quad (7)$$

$$\sum_{j=1}^{n_p} S_j = 1 \quad (8)$$

$$S_j = \frac{V_j}{\sum_{j=1}^{n_p} V_j} \quad (9)$$

$$V_j = \frac{n_j^p}{\rho_j} \quad (10)$$

$$u_j = -K\lambda_j(\nabla P_j - \gamma_j \nabla D) \quad (11)$$

$$K = \begin{bmatrix} k_{xx} & k_{xy} & k_{xz} \\ k_{yx} & k_{yy} & k_{yz} \\ k_{zx} & k_{zy} & k_{zz} \end{bmatrix} \quad (12)$$

A typical well rate relationship for a hydrocarbon component i in moles/day used in a reservoir simulator has the form:

$$q_i = \sum_{k=1}^{n/y} WI_k (\lambda_o \rho_o x_i + \lambda_g \rho_g y_i)(p_k - P_{bh} - \gamma_{well} \Delta z_k) \quad (13)$$

Layer Well Index

WI is commonly referred to as the layer well index. It relates the well-cell finite-difference grid pressure to the well bottom-hole-pressure through the steady state pressure profile near the well and the determination of an equivalent radius $r_o$ for the well cell. What are known as Peaceman formulae are frequently used for determining layer well index in reservoir simulators and this has been later extended to anisotropic rectangular grids and other more complex situations.

In Equation (13), λ represents the fluid phase mobility and $\gamma_{well}$ is the wellbore gravity gradient which depends on the fluid mixture density in the wellbore. $P_{bh}$ is the bottom-hole-pressure at well reference depth and $p_k$ is the well cell pressure. A generalized form of reservoir simulation with the Peaceman well index is contained as Appendix B in Fung et al.: "Unconstrained Voronoi Grids for Densely Spaced Complex Wells in Full-Field Reservoir Simulation," SPE Journal, October 2014, pp 803-815.

The wellbore flow and constraints can be represented at varying level of details. In the simplest case, the entire well is considered as a single storage at steady-state condition and the fluid content is exactly the mixture of the total inflow from all the contributing layers. In this case, the fully-implicit well equation is simply Equation (13) where all variables are taken at the new time level. The next step is to include a mass balance equation of each fluid component for the well, but the entire well is still considered as a single storage. In this case, wellbore transients can be accounted for and the well equation set for the entire wellbore network will have nwvar=(nvar+1) equations where nvar is the number of fluid components. However, a more detailed well model can have the wellbores divided into several segments where the well-segment fluid component and total mass balances, plus the well constraint equations are solved simultaneously with the reservoir system of equations. For thermal simulation, an energy balance equation for each well segment is also needed.

Fully-Coupled Systems

The fully-coupled system with implicit well equations and implicit reservoir equations is as follows:

$$\begin{bmatrix} A_{WW} & A_{WR} \\ A_{RW} & A_{RR} \end{bmatrix} \begin{Bmatrix} X_W \\ X_R \end{Bmatrix} = \begin{Bmatrix} R_W \\ R_R \end{Bmatrix} \qquad (14)$$

Where the Jacobian derivatives of the nonlinear well and reservoir equations are:

$$A_{WW} = \frac{\partial F_w}{\partial X_w}; A_{WR} = \frac{\partial F_w}{\partial X_R}; A_{RW} = \frac{\partial F_R}{\partial X_W}; A_{RR} = \frac{\partial F_R}{\partial X_R}$$

with $X_W$ and $X_R$ being the well and reservoir variables, $R_W$ and $R_R$ being the initial well and reservoir residuals. Since each grid cell can have multiple equations, and the number of equations for the well grids and the reservoir grids can be different, nvar is used as the number of reservoir equations per grid and nwvar as the number of well equations per grid. It is to be noted that nvar in general is not equal to nwvar. Therefore, each non-zero in $A_{WW}$ is a dense block of (nwvar*nwvar); each non-zero in $A_{RR}$ is a dense block of (nvar*nvar); each non-zero in $A_{WR}$ is a dense block of (nwvar*nvar), and in $A_{RW}$ is a dense block of (nvar*nwvar).

The solution method for an implicit reservoir system is typically a preconditioned iterative method which is suitable for asymmetric ill-conditioned large sparse matrices. For a serial to limited parallel system, the nested factorization, NF, method or the defined-level incomplete lower-upper, ILU (k), triangular factorization with a domain decomposition method, such as the additive Schwarz method, are commonly used. A pressure predictor-corrector method known as the constraint pressure residual, CPR, method as a two-stage preconditioner is also well known in current art. The Krylov subspace methods for an asymmetric system matrix frequently used in the current art are the ORTHOMIN algorithm and the GMRES algorithm. Alternatively, the BICGSTAB algorithm is also used but is less popular due to the higher work counts per iteration.

As pointed out above, two earlier methods prior to the Rowsum or Colsum approximations were inefficient and complicated to apply for complex well and large coupled system of equations. These were solution of the fully coupled system directly with a preconditioned iterative method and solving the reduced system by preconditioning the full reduced system matrix. They can be useful for serial computation of a small coupled well-reservoir simulation system, but impractical for large scale parallel application of a robust simulator.

Solving the Fully Coupled System Directly Using a Preconditioned Iterative Method In this method, the composite matrix was solved directly. That is, the matrix equations were set:

$$A \cdot x = R \qquad (15)$$

Where:

$$A = \begin{bmatrix} A_{WW} & A_{WR} \\ A_{RW} & A_{RR} \end{bmatrix}; x = \begin{Bmatrix} X_W \\ X_R \end{Bmatrix}; R = \begin{Bmatrix} R_W \\ R_R \end{Bmatrix}$$

Figure 4A:
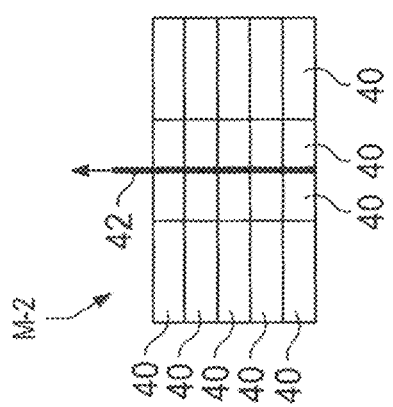
FIGS. 4A and 4B are schematic diagrams of an example of a fully-coupled fully-implicit well-reservoir Jacobian matrix for an example small model.
Figure 4B:
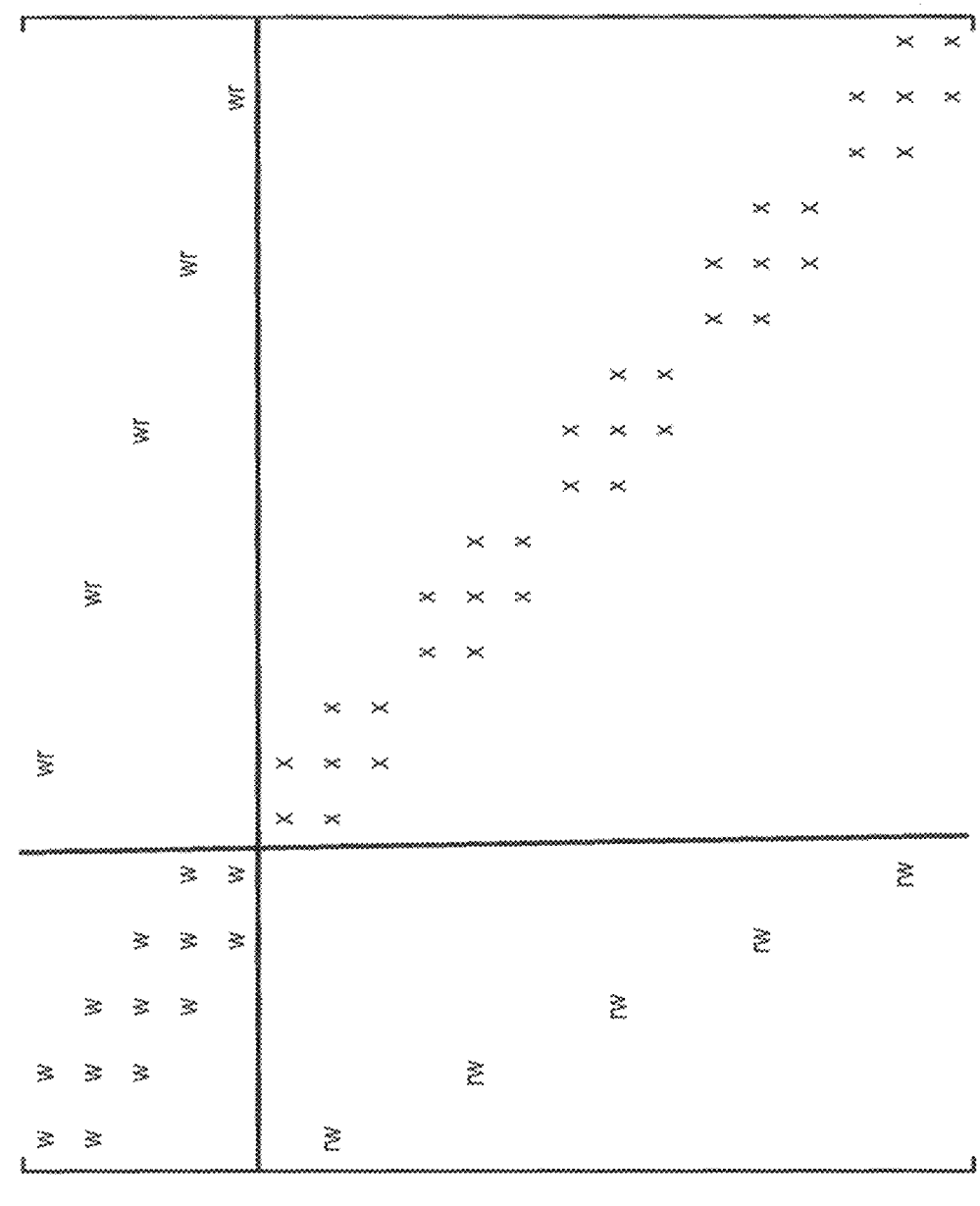

This approach solves the complete system together and obtains the solution vector $[X_W, X_R]$ simultaneously. FIG. 4B is small example model of the fully-coupled fully-implicit well-reservoir Jacobian matrix. An example of a small reservoir model M-2 with fifteen grid cells 40 and a wellbore 42 penetrating five grid cells at the center is shown in FIG. 4A. A matrix 44 in FIG. 4B depicts schematically the connectivity of the cells 40 at the reservoir ($A_{RR}$) and 42 of the wellbore ($A_{RW}$). The letters w, x, wr, and rw in the matrix of FIG. 4 represent the dense sub-matrices non-zeros for the well segment derivatives, reservoir grid derivatives, well-reservoir coupling derivatives, and reservoir-well coupling derivatives. This method may be used for small problems with a few wells in a small to moderate size model. It is a method which was popular in serial computation many years ago.

This method is more amenable to implementation in algebraic preconditioning method such as the level-of-fill incomplete lower upper ILU(k) triangular factorization method. It has been found not to be suitable for a structured-grid based preconditioning method such as the nested factorization (NF) method. The bookkeeping of cell assignments and matrix organization is more complex due to the irregular dense blocks to be factored as well as the negative implication on parallel domain decomposition methods. This was because wells can traverse multiple subdomains requiring more network communication to factorize and solve.

Solving the Reduced System by Preconditioning the Full Reduced System Matrix This solution method first decouples the well equation from the reservoir equation to form a reduced system:

$$\overline{A} \cdot X_R = [A_{RR} - A_{RW} A_{WW}^{-1} A_{WR}] \cdot X_R = [R_R - A_{RW} A_{WW}^{-1} R_W] \qquad (16)$$

The reduced system is solved to find the reservoir variables $[X_R]$. The solution for the well equations is obtained by the following back solve step after the reduced system has been solved to obtain the reservoir variables:

$$X_W = A_{WW}^{-1}(R_W - A_{WR} X_R) \qquad (17)$$

Figure 5A:
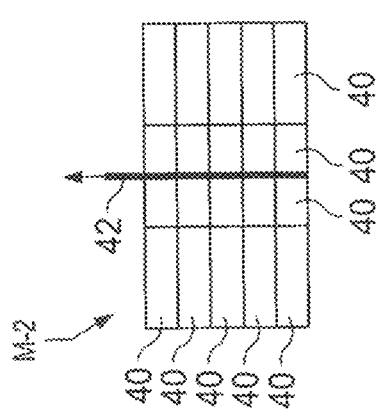
FIGS. 5A and 5B are schematic diagrams of an example of a reduced system matrix with additional non-zero dense block derivatives induced by fully-implicit well coupling terms.
Figure 5B:
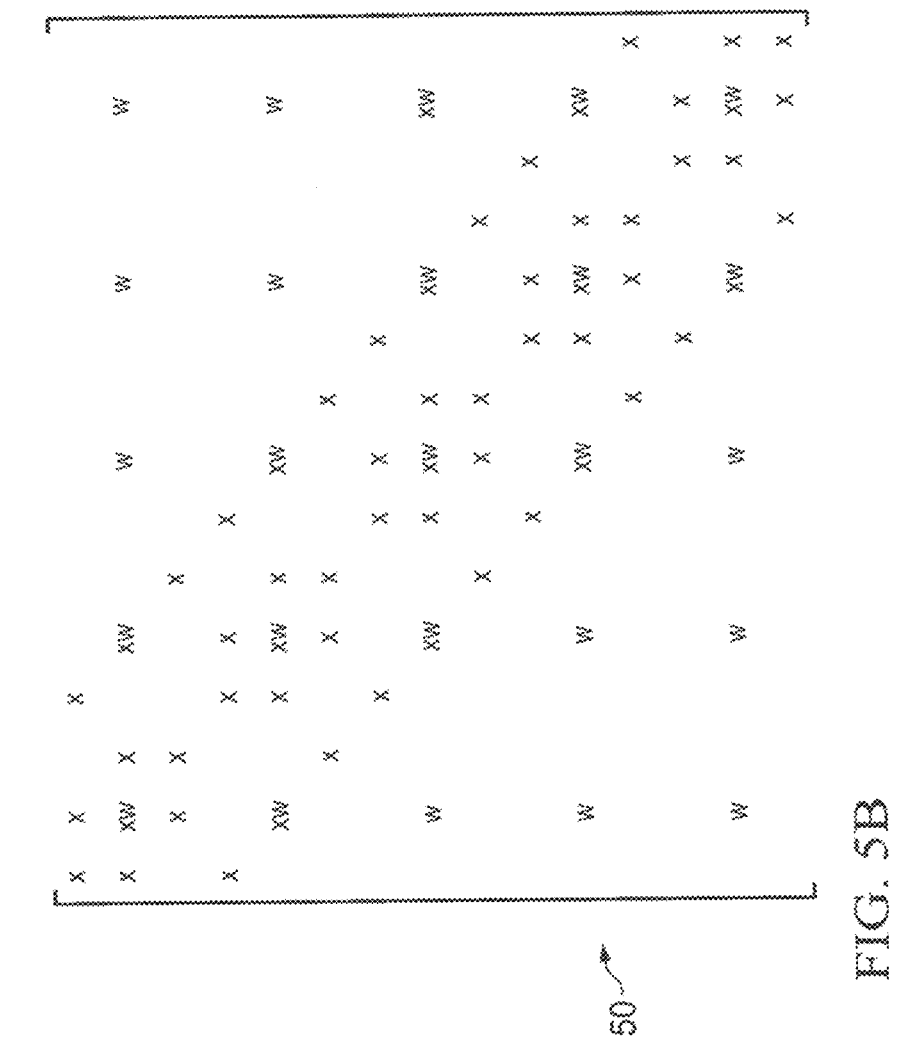

FIG. 5B shows the same example of reservoir model M-2 of FIGS. 4A and 5A with a reduced system matrix 50 according to Equation (16). FIG. 5B is a small example of the reduced system matrix with the additional non-zero dense block derivatives induced by the fully-implicit well coupling terms. When the wells in the model penetrate very few grid cells, this method could be acceptable. If the wells in reservoir, however, penetrate many grid cells, the number of additional non-zeros in the reduced system matrix 50 became excessive which render this method unattractive. This was because the reduced system matrix $[A_{RR} - A_{RW} A_{WW}^{-1} A_{wr}]$ had many well-induced non-zero terms, making it far more expensive to solve as compared to the reservoir matrix without the well terms.

Solving the Reduced System Using Rowsum or Colsum Preconditioning

The primary method of the current start-of-the-art for fully-implicit coupled system solution used in present simulators is either the Rowsum or Colsum preconditioning method. While the method is simple and suitable for wells with a moderate number of well perforated grid cells, it may start to break down with slow convergence, or fail to converge for the overall solver, when the simulation model contains many complex multi-lateral long-reach wells which may perforate thousands of grid cells with complex heterogeneity and with very high perforation multiphase flow rates. In these complex situations, the coupled solver can stall or fail to converge all together due to excessive well-influence-coefficient couplings which are only weakly preconditioned relative to the inter-cell flow terms.

Because the reduced system matrix $[A_{RR}-A_{RW}A_{WW}^{-1}A_{WR}]$ can have significantly more non-zeros than the original $A_{RR}$ matrix, it is not explicitly computed. For preconditioning, the current art do either a column sum (Colsum) or a row sum (Rowsum) is performed to diagonalize the well influence matrix. In the Nested Factorization (NF) preconditioning algorithm, NF is applied to the matrix:

$$A_{RR}-\text{Colsum}(A_{RW}A_{WW}^{-1}A_{WR}) \quad (18)$$

The Colsum matrix is a block diagonal matrix with block (nvar*nvar) where nvar is the number of equations to be solved per reservoir grid cells. In the incomplete lower upper (ILU) triangular factorization preconditioning algorithm, ILU is applied to the matrix:

$$A_{RR}-\text{Rowsum}(A_{RW}A_{WW}^{-1}A_{WR}) \quad (19)$$

The Rowsum matrix is a block diagonal matrix with block (nvar*nvar) where nvar is the number of equations to be solved per reservoir grid cells. The $[A_{RW}A_{WW}^{-1}A_{WR}]\{V\}$ matrix-vector product is computed as a series of matrix-vector multiplies whenever the product is needed.

Rowsum and Colsum preconditioning each require far fewer operations than preconditioning the full system matrix used earlier. However, if the wells penetrate many heterogeneous layers with high flow rates, the convergence of the solver is affected. In modern simulation, a full-field model may have thousands of wells, as can be seen in FIGS. 2 and 3, and each well can penetrate thousands of grid cells. In such field models the current Rowsum and Colsum preconditioning may have poor convergence or fail to converge for some problems.

Earlier preconditioning of the full system matrix as described above becomes prohibitively expensive while the other earlier method of direct solution of the fully coupled system is complex, also expensive, and difficult to parallelize for multiple processors. Thus, so far as is known, none of the prior methods have been sufficiently robust and efficient for large scale parallel reservoir simulation.

The Present Invention

To overcome the aforementioned difficulties, the present invention provides a computer implemented methodology which is robust, yet efficient to compute, based on and highly parallelizable preconditioner for the reduced system matrix. The present invention provides improvements to the existing technological processes of reservoir simulation used to analyze the performance of hydrocarbon reservoirs and evaluate their development. The present invention also improves the functioning of computers in performance of reservoir simulation in reducing the processing time lost due to poor convergence or failure to converge in the simulator processing, and also in reducing the complexity of communication within the network of the data processing system. In Equation (16):

$$\bar{A}=[A_{RR}-A_{RW}A_{WW}^{-1}A_{WR}] \quad (20)$$

The present invention takes the form of three embodiments. The first is based on a homogeneous one-level preconditioner. The second embodiment is a homogeneous two-level CPR-type preconditioner. The third embodiment is a heterogeneous combinative preconditioning method. The preconditioners used in the methodology of the three embodiments act as an accelerator for one of the Krylov subspace iterative algorithms such as the parallelized GCR(k), GMRES, or BICGSTAB methods. The present invention provides speedup in convergence of the coupled solution of the reservoir simulation. The present invention also provides an ability to generate good approximate update vectors to reduce the residuals of the coupled well-reservoir problem. Thus, the methodology of the present invention is fast, robust, and efficient to compute, highly parallelizable, and generate close approximate solutions.

Nomenclature $A_{RR}$=Reservoir Grid Jacobian Matrix
$A_{WR}$=Well to Reservoir Coupling Jacobian Matrix
$A_{RW}$=Reservoir to Well Coupling Jacobian Matrix
$A_{WW}$=Multi-Segment Well Jacobian Matrix
$A_P$=Pressure Coefficient Jacobian Matrix
$\bar{A}$=Reduced System Jacobian Matrix
C=Pressure Coefficient Selector
$C^T$=Transpose of the Pressure Coefficient Selector
$E_R$=Remainder Component of Reservoir Grid Jacobian Matrix
$E_W$=Well Influence Coefficient Jacobian Matrix
$M^{-1}$=Full-System Preconditioner
$M_{CPR}^{-1}$=Constraint Pressure Residual Preconditioner
$M_N^{-1}$=N-Term Line-Solve Power-Series Preconditioner
$P_R$=Partitioned Component of Reservoir Grid Jacobian Matrix
R, r=Residual Vector
W=Pressure decoupling operator matrix
X=Solution Vector
  Subscripts:
C=correction
P=pressure
R=reservoir
W=well
T=total Embodiment 1

Parallel One-Level Line-Solve Power-Series (LSPS) Preconditioning with Variable Orders for Well-Coupling and Reservoir-Grid Non-Zeros Fill Terms The homogeneous one-level preconditioning method is described as follows: In this method, the following substitutions are made:

$$A_{RR}=[P_R+E_R] \quad (21)$$

$$E_W=-A_{RW}A_{WW}^{-1}A_{WR} \quad (22)$$

Therefore, $$\bar{A}=A_{RR}+E_W \quad (23)$$

And the reduced-system residual:

$$R=[R_R-A_RA_{WW}^{-1}R_W] \quad (24)$$

This gives the simplified form of the reduced system matrix equation:

$$\bar{A} \cdot X_R=[P_R+E_R+E_W]X_R=R \quad (25)$$

Further:

$$E_T = E_R + E_W = E_R - A_{RW} A_{WW}^{-1} A_{WR} \quad (26)$$

And then:

$$\overline{A} = [P_R + E_T] = [P_R + E_R + E_W] \quad (27)$$

To obtain the familiar form of a linear system:

$$\overline{A} \cdot X_R = R \quad (28)$$

In the above reduced system equations, $P_R$ is the part of $A_{RR}$ whose non-zeroes are used to generate the LU factors so that the result of $P_R^{-1} \cdot V$ can be easily computed. For example, one suitable choice of $P_R$ is the block tridiagonal matrix for a Z-Line ordered reservoir system of equations.

Another possible choice would be the maximum connection factor ordered block tridiagonal portion of the reservoir matrix. In a fractured dual-porosity dual-permeability system, or a fractured multi-modal porosity system, all the connection factors of all the pore space partitions at the same spatial location and the Z-line or the direction with the maximum connection factor are all part of $P_R$.

An approximate inverse preconditioner using N-term power series, $M_N^{-1}$, can be written as:

$$\overline{A}^{-1} \approx M_N^{-1} = \left[ I + \sum_{K=1}^{N} (-1)^K (P_R^{-1} E_T)^K \right] P_R^{-1} \quad (29)$$

Further, due to the different significance of the $E_T$ components, if we keep terms for $E_R$ and $E_W$ up to different orders to save work:

$$M_N^{-1} = \left( \prod_{K=M+1}^{N} \left( I + (P_R^{-1} E_R)^{2^{K-1}} \right) \right) \cdot \quad (30)$$

$$\left( \prod_{K=2}^{M} \left( I + (P_R^{-1} E_T)^{2^{K-1}} \right) \right) \cdot (I - P_R^{-1} E_T) \cdot P_R^{-1}$$

Satisfying M≥2; N>M; otherwise, the respective terms in the above matrix equation is the identity matrix [I]. Some special cases can be illustrated as follows:

For example, by keeping only the first order term for $E_W$, then $$M_N^{-1} = \left( \prod_{K=2}^{N} \left( I + (P_R^{-1} E_R)^{2^{K-1}} \right) \right) \cdot (I - P_R^{-1} E_T) \cdot P_R^{-1}; N \geq 2 \quad (31)$$

If the same order for $E_R$ and $E_W$ are kept, then the preconditioner becomes $$M_N^{-1} = \left( \prod_{K=2}^{N} \left( I + (P_R^{-1} E_T)^{2^{K-1}} \right) \right) \cdot (I - P_R^{-1} E_T) \cdot P_R^{-1}; N \geq 2 \quad (32)$$

If N is set to 2 and only the first order terms for $E_W$, then $$M_N^{-1} = (I + (P_R^{-1} E_R)^2) \cdot (I - P_R^{-1} E_T) \cdot P_R^{-1} \quad (33)$$

It is not necessary to build the approximate inverse matrix directly. The approximate inverse preconditioner for the reduced coupled fully-implicit system is applied as a series of matrix-vector multiply whenever an approximate solution update is needed. This embodiment of preconditioner addresses the smoothing of the error components arising from the well influence coefficients directly but at a moderate additional cost which can be control to the desired optimal level for speed and robustness of the coupled system solution. This is an advantage over techniques prior which can cost excessive solver iterations or convergence failure when there is a large complex simulation system with significant coupling between wells and reservoirs. As noted, the Rowsum or Colsum method has been too weak to be effective.

The preconditioned Krylov subspace algorithm for solving the reduced system Equation (25) is illustrated below using the generalized constraint residual GCR(k) method as follows:

$$\text{Compute } r_o = R - \overline{A} \cdot X_o \quad (34)$$

$$\text{Set } p_o = M_N^{-1} \cdot r_o \quad (35)$$

For j=0, 1 . . . , step until convergence DO:

$$\overline{A} = [P_R + E_R + E_W] \quad (36)$$

$$\alpha_j = \frac{(r_j, \overline{A} p_j)}{(\overline{A} p_j \cdot \overline{A} p_j)} \quad (37)$$

$$x_{j+1} = x_j + \alpha_j p_j \quad (38)$$

$$r_{j+1} = r_j - \alpha_j A p_j \quad (39)$$

$$\text{Compute } \beta_{ij} = -\frac{(\overline{A} M^{-1} r_{j+1}, \overline{A} p_i)}{(\overline{A} p_i, \overline{A} p_i)} \quad (40)$$

For i=s, . . . , j:

$$p_{j+1} = M_N^{-1} \cdot r_{j+1} + \sum_{i=k}^{j} \beta_{ij} p_i \quad (41)$$

Enddo

For s=0, the above algorithm is a generalized constraint or GCR based. For s=max (0, j−k+1), the algorithm is ORTHOMIN based. GCR(k) is simply a restart version of GCR. The GMRES and BICGSTAB algorithms can also be used alternatively and similarly.

Figure 15:
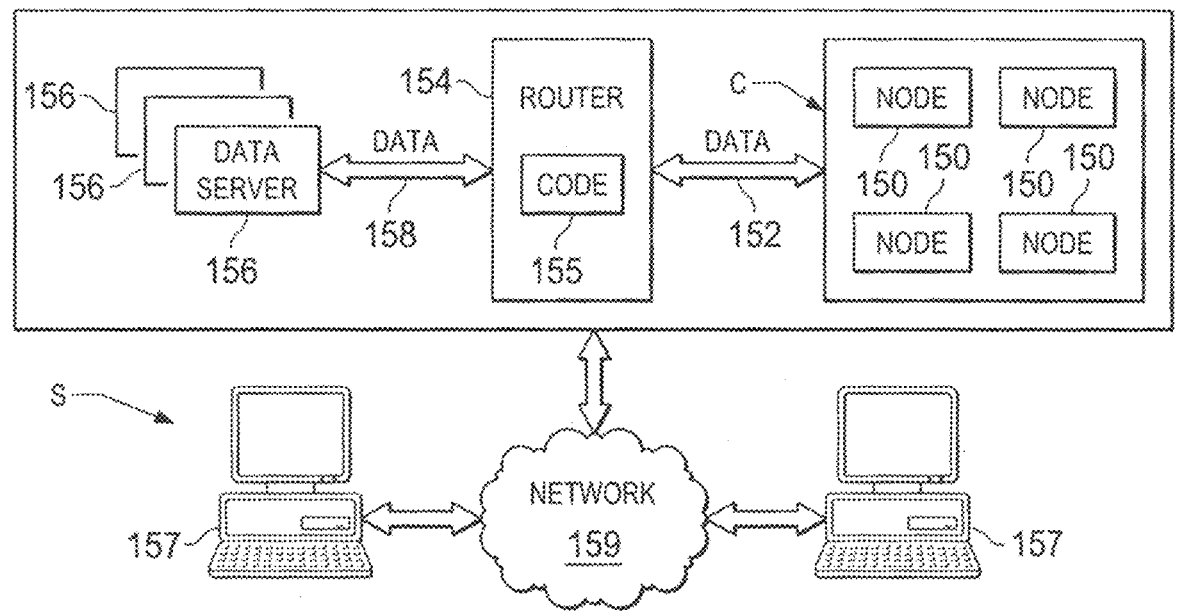
FIG. 15 is a schematic diagram of a computer network for fully-coupled fully-implicit wellbore modeling according to the present invention.

Flow chart 60 of FIG. 6 illustrates the structure of the logic of the present invention for the parallel-level line-solve power series preconditioning embodiment as implemented in a data processing system or computer such as that shown at S in FIG. 15. Those skilled in the art will appreciate that the flow charts illustrate the structures of computer program code elements including logic circuits on an integrated circuit that function according to this invention. Manifestly, the invention is practiced in its essential embodiment by a machine component that renders the program code elements in a form that instructs a digital processing apparatus (that is, a computer) to perform a sequence of function steps corresponding to those shown.

It is important to note that, while the present invention has been, and will continue to be, described in the context of a fully functional computer system, those skilled in the art will appreciate that the present invention is capable of being distributed as a program product in a variety of forms, and that the present invention applies equally regardless of the particular type of non-transitory signal-bearing media utilized to actually carry out the distribution. Examples of non-transitory signal-bearing media include: recordable-type media, such as floppy disks, hard disk drives, and CD ROMs.

It should be understood that the processing described herein can be implemented in a variety of other types of reservoir simulators. It can be run on a variety of computer platforms, such as single CPU, a shared memory parallel or massively parallel processing computer, a distributed memory super-computer, and a variety of PC clusters, such as a self-made PC cluster, or a production PC cluster.

In the sequence of FIG. 6, a flow chart 60 indicates a sequence of processing steps according to the present invention. The processing sequence is entered at step 61 from a main reservoir simulator processing sequence of the type described herein. During a first processing step 61 a composite Jacobian matrix according to Equation (15) is constructed for the nonlinear well and reservoir equations.

Then, during a step 63, an iteration counter i is set to 0, and an estimate xi and is selected so that a matrix calculation $$r_i = b - [A]x_i$$

may be made.

In a step 65, parallel one-level line-solve power-series (LSPS) with variable orders for well-coupling and reservoir-grid non-zeros fill terms is applied as described above in connection with Equations (29) through (33) where equations (30) is the general form of the preconditioner described in equation (29) and equations (31), (32), (33) are specific examples of the forms of the preconditioner.

In step 65, the approximate solution vector $X_R = \overline{A}^{-1} \cdot R \approx M_N^{-1} \cdot R$ is according to Equation (28), the components of which are detailed by equations (21) through (27) which involves the fully-coupled fully-implicit well influence Jacobian matrix. The approximate inverse preconditioner is applied within the Krylov subspace iterative method, as will be described.

This computation is performed using the truncated Neumann series expansion in the manner described above. If a parallel computation array is being used, communication between adjacent processors is done during step 65, in a manner to be described below.

Next, during step 67, a truncated general conjugate residual or GCR(k) method is applied to solve the system of well and reservoir equations, as described above in connection with the methodology of Equations (34) through (41). Again if a parallel computation array is in use, communication between adjacent processors is performed. Besides GCR(k), alternative Krylov subspace iterative methods, such as parallel versions of GMRES or BICGSTAB methods, may also be used in this step.

In step 69, the residual result obtained during step 67 is compared with a user specified tolerance of residual. If the obtained residual result is not within the user specified tolerance, the iteration counter is incremented and processing returns to step 65 for another processing cycle in the manner described above for subsequent iterations. The well solution vector is computed using Matrix equation (17) after the reservoir solution vector has been computed.

Processing proceeds in the foregoing manner until a solution value for the residual is found within the user specified tolerance range during step 67 of an iteration cycle. At this time, the results obtained for the well and reservoir equations of the fluids yielding the satisfactory residual in the grid cells are stored in memory of the processor or processors proceeding according to the instruction steps of FIG. 6. Control of the processor or processors then reverts to the main reservoir simulator sequence. Displays of the results of satisfactory processing according to FIG. 6 are made on user request.

The procedure is the same for both the serial application and the parallel application of the method. In the parallel application of the method, an interprocessor communication step is performed prior to the matrix-vector multiplication where the elements of the intermediate solution vector situated at the boundary of a data partition need to be exchanged between the processors sharing an internal domain boundary.

Embodiment 2

Parallel CPR-Type Line-Solve Power-Series Preconditioning

What is known as the constraint pressure residual, CPR, preconditioning method was first described in Wallis, J. R. et al.: "Constrained Residual Acceleration of Conjugate Residual Methods," SPE 13563, Proceedings of the 8th SPE Reservoir Simulation Symposium, Dallas, USA Feb. 10-13, 1985. A variant of the CPR method was further discussed in Fung & Dogru "Parallel Unstructured Solver Methods for Simulation of Complex Giant Reservoirs," SPE (December-2008), pp. 440-446.

The constraint pressure residual procedure is adapted and improved to solve the coupled well-reservoir system, with the matrix terms used being defined according to the Nomenclature definitions. The CPR preconditioning according to the present invention involves a pressure predictor-corrector step and can be written as:

$$M_{CPR}^{-1} = M^{-1}[I - \tilde{A}CA_p^{-1}C^T] + (CA_p^{-1}C^T) \quad (42)$$

Where:

$$\tilde{A} = W * A \quad (43)$$

And the pressure matrix is $$A_p = C^T \tilde{A} C \quad (44)$$

C is given by $$C = \begin{bmatrix} e_p & & & \\ & e_p & & \\ & & \ddots & \\ & & & e_p \end{bmatrix} \quad (45)$$

Assuming pressure is a first unknown for each cell, then, let $e_p$ be the nvar×1 vector where nvar is the number of equations per grid cell:

$$e_p = \begin{bmatrix} 1 \\ 0 \\ \vdots \\ 0 \end{bmatrix} \quad (46)$$

The aim of W is to perform an IMPES-like reduction step on A. For example, W can be computed as:

$$W = \mathrm{DIAG}^{-1}(A) \quad (47)$$

The notation DIAG(A) denotes the main diagonal nvar*nvar sub-matrix blocks of A. Note that W needs to be chosen such that $\tilde{A}_p$ is close to being positive definite for PAMG to work well as the pressure solver. This is not a requirement for LSPS or any of the ILU variants.

Thus, the CPR preconditioning step $x=M_{CPR}^{-1}r$ can be outlined as follows:

1. Restrict the full system residual to the pressure system $$r_P = C^T Wr \quad (48)$$

2. Iteratively solve the pressure system $$A_P x_P = r_P \quad (49)$$

3. Expand pressure solution to full system $$s = C x_P \quad (50)$$

4. Correct the full system residual from pressure residual $$r_c = r - A \cdot s \quad (51)$$

5. Solve the full system using second stage preconditioning $$Mx = r_c \quad (52)$$

6. Correct full system solution from pressure solution $$x_c = x + s \quad (53)$$

7. The pressure system preconditioning can be accomplished in a number of ways, including the use of a parallel algebraic multi-grid or PAMG method, or the ILU(k) or the LSPS method as described in Embodiment 1 above.

The preferred full system preconditioning method is the LSPS method. The pressure system solver is normally limited to a few Krylov subspace iterations of the GCR(k) or the GMRES, or the BICGSTAB method. For the PAMG method, it is usually limited to a single local vector V multi-grid cycle. The full-system preconditioned solution in Equation (52) also uses one of the Krylov subspace method as outlined in Equations (34) through (41).

Figure 7:
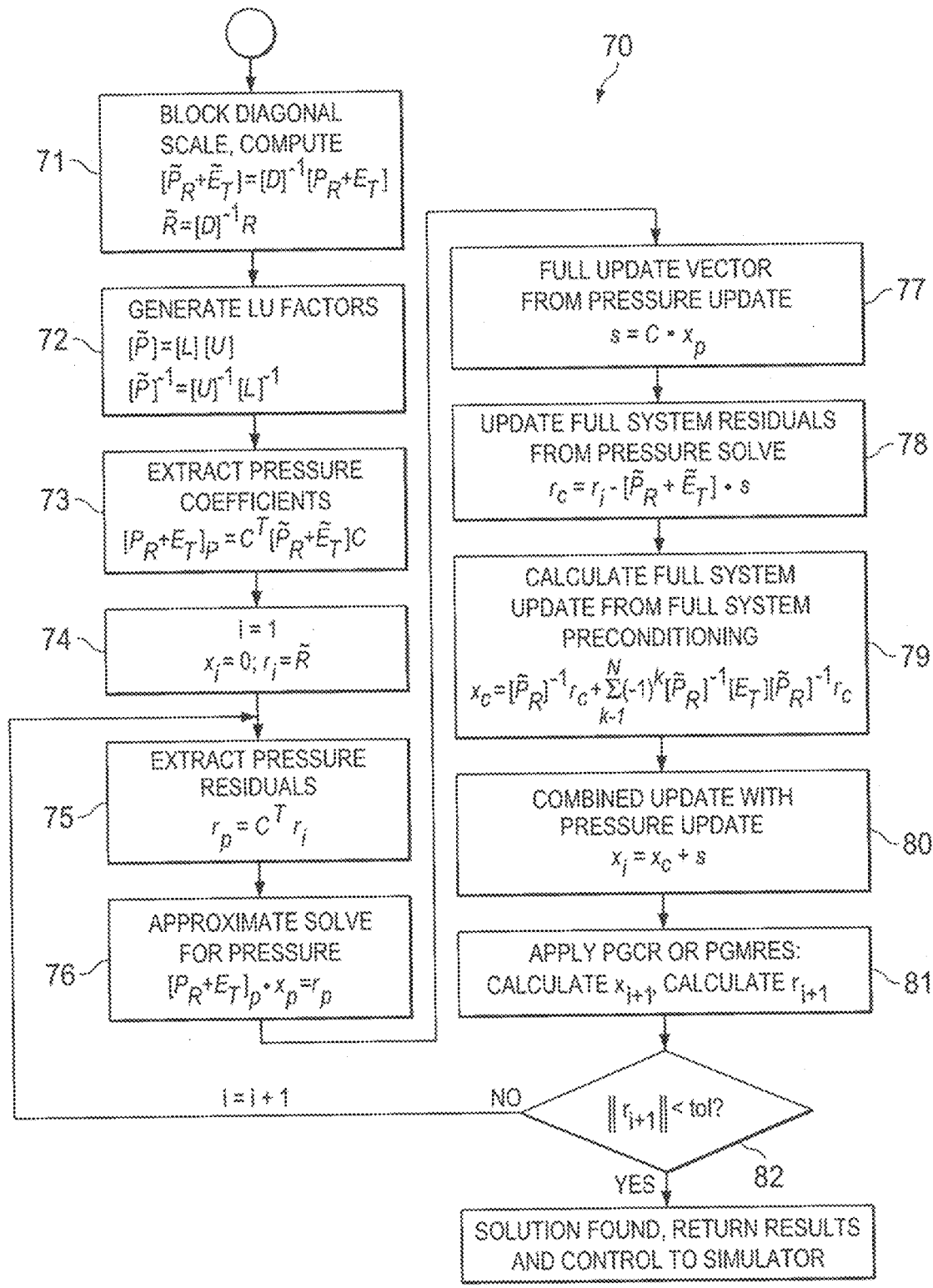
FIG. 7 is a functional block diagram or flow chart of data processing steps for fully-coupled fully-implicit wellbore modeling in reservoir simulation according to other embodiments of the present invention.

FIG. 7 shows a schematic flow diagram 70 for a solver method for parallel constraint pressure residual or CPR-type line-solver power series preconditioning according to the second embodiment of the present invention. The approximate inverse preconditioning method used in determining an approximate solution vector involves the fully-coupled well influence matrix $E_W = -A_{RW} A_{WW}^{-1} A_{WR}$ which is applied within one of Krylov subspace iterative algorithms during both the pressure solution and full-system solution. The well solution vector is computed using Matrix equation (17) after the reservoir solution vector has been computed. The processing shown in FIG. 7 is performed in the data processing systems of FIG. 15.

Step 71 as indicated in FIG. 7 scales the block rows of the system matrix by the block diagonal inverse. Since data store for the entire block rows of each subdomain is local, this step is fully parallel and requires no synchronization. Step 72 as indicated, computes upper and lower decomposition [L] [U] matrices for [P]. The [P] matrix is the partitioned Jacobian matrix [$P_R$] described in equation (25) and the inverse [$P_R^{-1}$] as in equations (29) to (33) is computed as $[U]^{-1}[L]^{-1}$.

Step 73 extracts the pressure coefficients matrix from the full-system coefficient matrix. [C] and $[C]^T$ are the restriction and prolongation operators in the algebraic extraction process. Step 74 simply initializes the full-system iteration process.

Step 75 extracts the pressure residual from the full system residuals. Step 76 performs an approximate pressure solution. The solution method is the preconditioned Krylov subspace method. The preconditioner can be the parallel line-solve power-series method as shown in equation (29) or a parallel algebraic multigrid method PAMG. The pressure solution only requires a rough approximate solution. Step 76 includes the MPI communication method at each matrix-vector multiplication. This method includes communication hiding strategy to enhance parallel scalability. The pressure solution is used to constrain the full system residual to accelerate the full-system solution.

Step 77 expands the pressure solution vector to a full-system solution vector. This is used to reduce the full-system residual in step 78. In step 79, the reduced full-system residual is then used to compute an approximate full-system update using the matrix equation as indicated. The combined update from both the pressure system and full system is computed in step 80. Step 81 is the full-system version of the parallel GCR(k) or GMRES(k) algorithm which optimizes on the full-system update such that the residuals are minimized. Step 82 is the full-system convergence check. The i-indexed iterative loop from steps 74 to 82 is the full-system iterative solution loop.

Steps 76, 78, 79, and 81 use embedded matrix-vector multiplication which involves MPI communication with communication hiding algorithm. The matrix-vector multiplications for interior cells are done simultaneously with the MPI communication. When communication is complete, local vector V now contains all ghost cell information and the matrix-vector multiplication can be done for the remaining boundary cell. Steps 76 and 81 involve distributed vector dot product which requires MPI reduction operations. The other steps are fully parallel steps.

Embodiment 3

Parallel Combinatory Preconditioning

This heterogeneous preconditioning method uses the preconditioning according to Embodiment 1 above for the well influence coefficient matrix, but includes a different method for the reservoir coefficient matrix. This is helpful if it is desired to apply different preconditioners for the reservoir terms and the well-influence terms. The combinatory preconditioner is written as:

$$A^{-1} \approx M_C^{-1} = M_R^{-1}[I - A \cdot [M_W^{-1}]] + M_W^{-1} \quad (54)$$

The general form of the well-influence-term preconditioner can be written as:

$$M_N^{-1} = \left( \prod_{K=2}^{N} \left( I + (P_R^{-1} E_W)^{2^{K-1}} \right) \right) \cdot (I - P_R^{-1} E_W) \cdot P_R^{-1}; \quad (55)$$

$$N \geq 2$$

Frequently, only a low order approximation is needed to improve convergence. The $M_R^{-1}$ may be another effective preconditioner for the reservoir terms. For example, the ILU(k) or ILUT for the reservoir part of the A matrix with a suitable domain decomposition method for parallel application may be chosen here. If $M_R^{-1}$ is the ILU(k) preconditioner, then:

$$M_R^{-1} = M_{ILU}^{-1} \quad (56)$$

Processing according to Embodiment 3 of the present invention in data processing system S is performed according to the methodology of FIG. 6, with the exception that for the preconditioner applied according to step 65 is according to Equations (54) through (56) above.

Again, a two-stage CPR preconditioner can be equally applied in the parallel combinatory preconditioning. In this application, the pressure system preconditioning method can be parallel algebraic multigrid or PAMG, while the full-system preconditioning method can be the parallel combinatory preconditioning method. This method is used as the preconditioning method in a Krylov subspace iterative algorithm.

One such algorithm GCR(k) was discussed previously in Equations (34) through (41). The Krylov subspace method using the GCR(k) algorithm includes an approximate inverse preconditioning method for calculating the approximate solution vector which involves the fully-coupled fully-implicit well influence Jacobian matrix $E_W = -A_{RW} A_{WW}^{-1} A_{WR}$. The approximate inverse preconditioner is applied within the Krylov subspace iterative algorithm.

Figure 8:
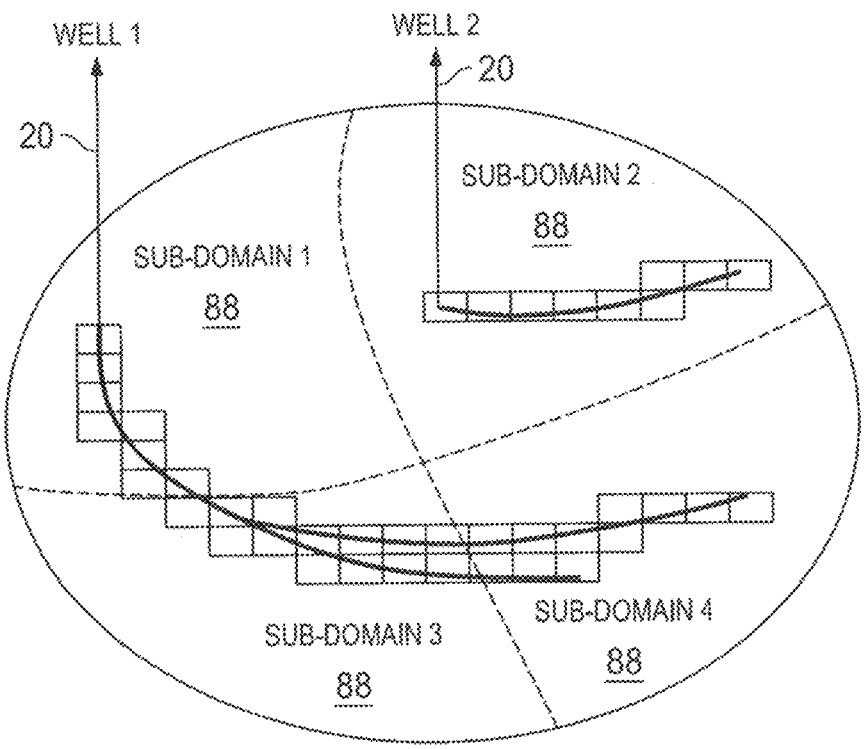
FIG. 8 is a schematic diagram of small model example of a reservoir subdivided into subdomains to be processed by computer processing cores according to the present invention.
Figure 9:
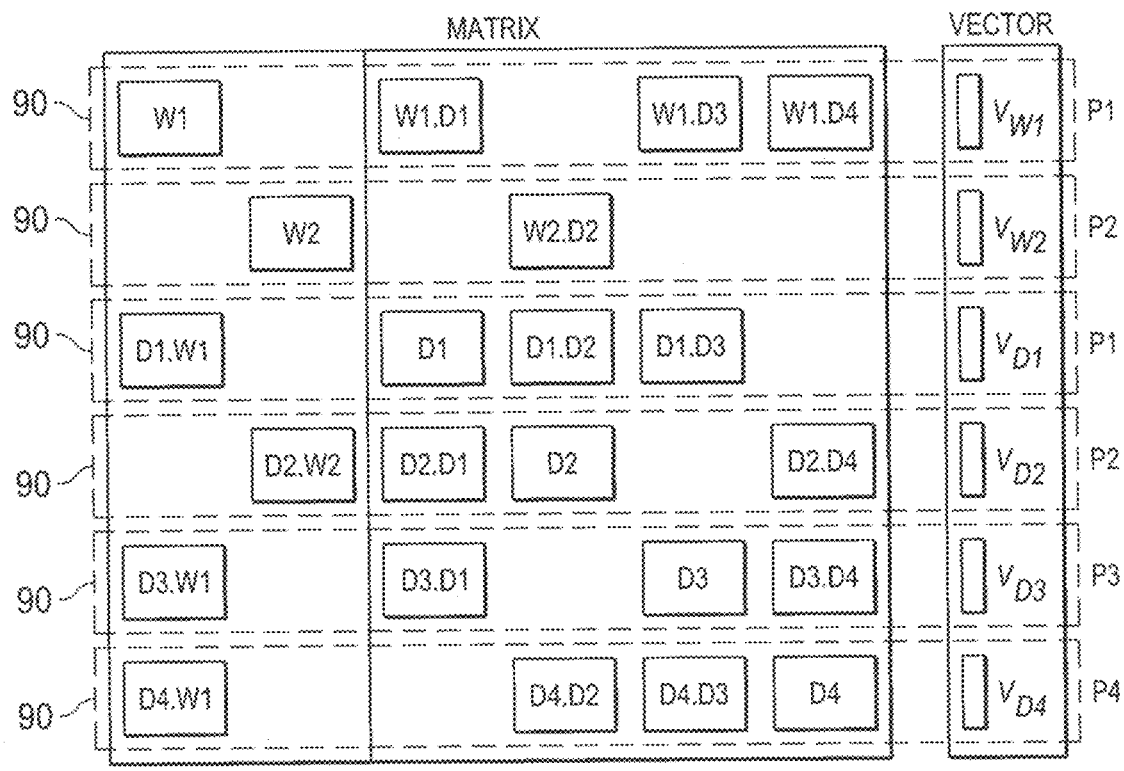
FIG. 9 is a schematic diagram of partitioned matrix and vector data according to the present invention for the model of FIG. 8.

Distributed Parallel Method for Fully-Coupled Fully-Implicit Well-Reservoir Solution FIGS. 8 and 9 illustrate schematically organization of grid data for distributed parallel processing of the unstructured subdomains of the reservoir grid of Domain D of FIG. 1 in order to process the data for the coupled implicit well bores such as shown at 20 and 22 in FIGS. 2 and 3, respectively. The data for distributed parallel processing for the reservoir domain is partitioned for the structured-grid and unstructured-grid into multiple subdomains, with each subdomain assigned to a different compute process is described in U.S. Pat. Nos. 8,433,551 and 8,386,227, respectively, in each of which Applicant is named as an inventor. The distributed parallel processing for the fully-coupled fully-implicit well-reservoir solution is accomplished in the following manner.

For each of the wells 20 and 22, the full set of all the active wells in the model are distributed to the participating compute processes of the data processing system S. For example, as a simplified model, where there are four wells and four compute processes, each well is run on a different compute core of the data processing system S, and the compute cores jointly solves the fully-coupled simulation model of the reservoir grid blocks and the wells. Thus, each processing core and its associated data storage works on and stores data for each one of the wells.

In another example, if there are two wells but four processing cores for as shown in FIG. 8, then, processor cores for two processors receive data for the two wells, respectively, but the remaining cores do not have the ownership of any processing for the wells. FIG. 8 shows four subdomains 88 into which the reservoir grid blocks are partitioned, with two complex wells 20, penetrating certain ones of the subdomains 88 as indicated. The reservoir grid of domain D has two complex wells 20. Well 1 intersects grid blocks in subdomains 1, 3, and 4. Well 2 intersects grid blocks in subdomain 2. FIG. 9 illustrates schematically the allocation and distribution of matrix data and vector data for the solution of the well-reservoir coupled model of FIG. 8. The matrix shown in FIG. 9 is comparable to those shown in FIGS. 4 and 5, wherein FIGS. 4 and 5 illustrate the matrix dense blocks in detail for a serial instance, but FIG. 9 shows the high-level schematic layout where each named block represents a matrix of many internal dense blocks. The labels on the block indicate the types of dense blocks contained within. For example, the label W1.D1 indicates the dense blocks contained inside are to do with the connections between the well 1 and subdomain 1, and so on. Data for each of the subdomains 1, 2, 3, and 4 are allocated to processing cores P1, P2, P3, and P4. Well 1 is allocated to P1 and well 2 is allocated to P2.

The vector shown in FIG. 9 represents either the residual vector, the solution vector, or other block-length vectors in the solution process. In FIG. 9, each long horizontal box 90 schematically represents the collection data belonging to a compute process P1, P2, P3 or P4. The well data groups W1, W1.D1, W1.D3, and W1.D4 of FIG. 9 represent the well-segment internal data and well-segment to well-segment data, as well as well-to-grid data stored in process P1. Well data group W1.D1 represents the matrix data of the interaction terms between well segments belonging to well 1 and the perforated grid cell data belonging to subdomain 1, and so on. Grid data groups D1.W1, D1, D1.D2, and D1.D3 are the grid-to-well data, grid cell internal data, grid-to-grid interaction data within subdomain 1 and between subdomain 1 and another subdomain, in this example subdomains 2 and 3. The grid data group D1.D2 shown in FIG. 9 represents the inter-block flow-term derivatives in the Jacobian matrix of the grid cells on the boundary of subdomain 1 adjacent to the boundary of subdomain 2. The inter-block flow-term derivatives of grid data group D1.D2 are also stored in process P1.

Inter-process communications are provided according to the present invention to construct part of the Jacobian matrix representing boundaries of subdomains or well-to-grid grid-to-well interaction terms which do not belong to the same compute process. Inter-process communications are also provided to solve the resulting system of algebraic equations. For example, the well-to-grid Jacobian term W1.D3 shown in FIG. 9 indicates the transfer of grid block data in P3 which are penetrated by well 1 to process P1 to calculate them and data for well 1 from process P1 is need by process P3 to do processing for D3.W1 and so on. The coupling terms involving information partially owned by another process thus has those data transferred locally to complete the construction of the coupling term.

Similarly, inter-process communications for grid-to-grid flow term for grid blocks located at the boundaries of subdomains are also provided. For the construction of the grid data group D2.D1 and D1.D2 for grid cells adjacent the respective subdomain boundaries, data exchange between processes P1 and P2 is provided. Similarly, for construction of grid data groups D1.D3 and D3.D1, data exchange between processes P1 and P3 is provided, and so on.

In the solution process, data elements in the vector which are required by the matrix-vector operation are inter-process communicated to the processor P which has processing ownership of the matrix components. For example, vector components from VD3 and VD4 are communicated to process P1 for matrix-vector operations with the matrix components W1.D3 and W1.D4. The required vector components from VW1 are also communicated to P3 and P4 for matrix-vector operation with D3.W1 and D4.W1. The vector can be an intermediate solution vector, or a residual vector, or an intermediate product resulting from a partially completed matrix-vector multiplication sequence.

With the present invention, as shown in FIG. 9, communication hiding is achieved by organizing the data so that the grid blocks and connections which do not share boundaries with other subdomains are ordered first. They are followed by boundary grid cells belonging to this subdomain called the inner halo and finally boundary grid cells belonging to neighboring subdomain called the outer halo. Similarly, internal cell-to-cell connections and their connection factor are ordered first and the cell-to-cell connections between a cell in this subdomain and a cell belonging to a neighboring subdomain are organized at the end in consecutive banks of each neighboring subdomains. Computation for internal grid blocks and connections and communication can be carried out simultaneously while the computation for the inter-subdomain connection can only start after the inter-process communication has been completed.

The processing and method steps of FIGS. 6 and 7 are suitable for deployment on a variety of today's HPC hardware. These are typically rack mounted hardware with several compute nodes which contains multiple CPUs with multi-core architecture. Nodes are interconnected with conventional low latency high bandwidth networks, switches, and routers.

Figure 16:
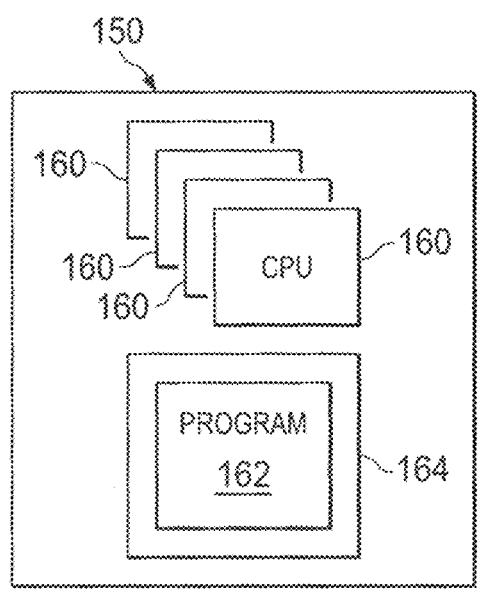
FIG. 16 is a schematic diagram of an application server or computer node of the computer network of FIG. 15.

The typical HPC environment for use with this simulation system is today's multi-node, multi-CPU, multi-core compute clusters. An example such cluster is illustrated at C in the data processing system S of FIGS. 15 and 16. The cluster C is formed of a plurality of computer nodes 150 (FIGS. 15 and 16) which are provided with data in parallel as indicated by and arrow 152 by a router server or servers 154. If desired, several such router servers may be used for this purpose. Original simulation or input data of the types described above is stored in a suitable number of data storage/file servers 156. The router servers 154 under control of computer code 155 stored in memory transfer input simulation data in parallel from the storage servers 156, as well as simulation processing results as indicated by an arrow 158, to and from the computer nodes 150 of the cluster C. The program code 155 according to the present invention is in the form of non-transitory computer operable instructions causing the server or servers 154 to index, order and transfer the data. Typically, the data processing system D includes a set of work stations 157 of suitable, conventional type which are connected to the system by a network 159.

The computer nodes 150 of the cluster C include a plurality of processors or cores 160 of the type illustrated in FIG. 6 operating in parallel under instructions of a computer code or program product 162 stored in stored in memory 164 of the computer nodes 150. The program code 162 according to the present invention is in the form of non-transitory computer operable instructions causing the data processors 160 to simulate fluid flow in a fractured subterranean reservoir where the pore space has been characterized as a multi-continuum.

It should be noted that program codes 155 and 162 may be in the form of microcode, programs, routines, or symbolic computer operable languages that provide a specific set of ordered operations that control the functioning of the data processing system D and direct its operation. The instructions of program codes 155 and 162 may be stored in memory of the servers 154 or processor nodes 150, or on computer diskette, magnetic tape, conventional hard disk drive, electronic read-only memory, optical storage device, or other appropriate data storage device having a non-transitory computer usable medium stored thereon. Program code 160 may also be contained on a data storage device such as server 156 as a computer readable medium, as shown.

RAM and cache memory are distributed and local to each compute node and are shared by the processing cores on each the node. The physics simulated by the system of the present invention is a tightly coupled, global multiphase flow problem which is both convective and diffusive in nature. A high bandwidth, low latency network is thus preferred to minimize inter-process communication overhead. The message passing interface (MPI) standard is used for inter-process communication operations while MPI-2 is used for parallel I/O operations. Disk storage for simulation or model data and processing output results are typically on centralized NAS, SAN, GPFS, or other parallel file systems. For smaller scale parallelism, local hard disk storage which resides on the cluster can also be used. Parallel distributed I/O methods are used to minimize read/write time from/to disk during simulation.

Figure 10:
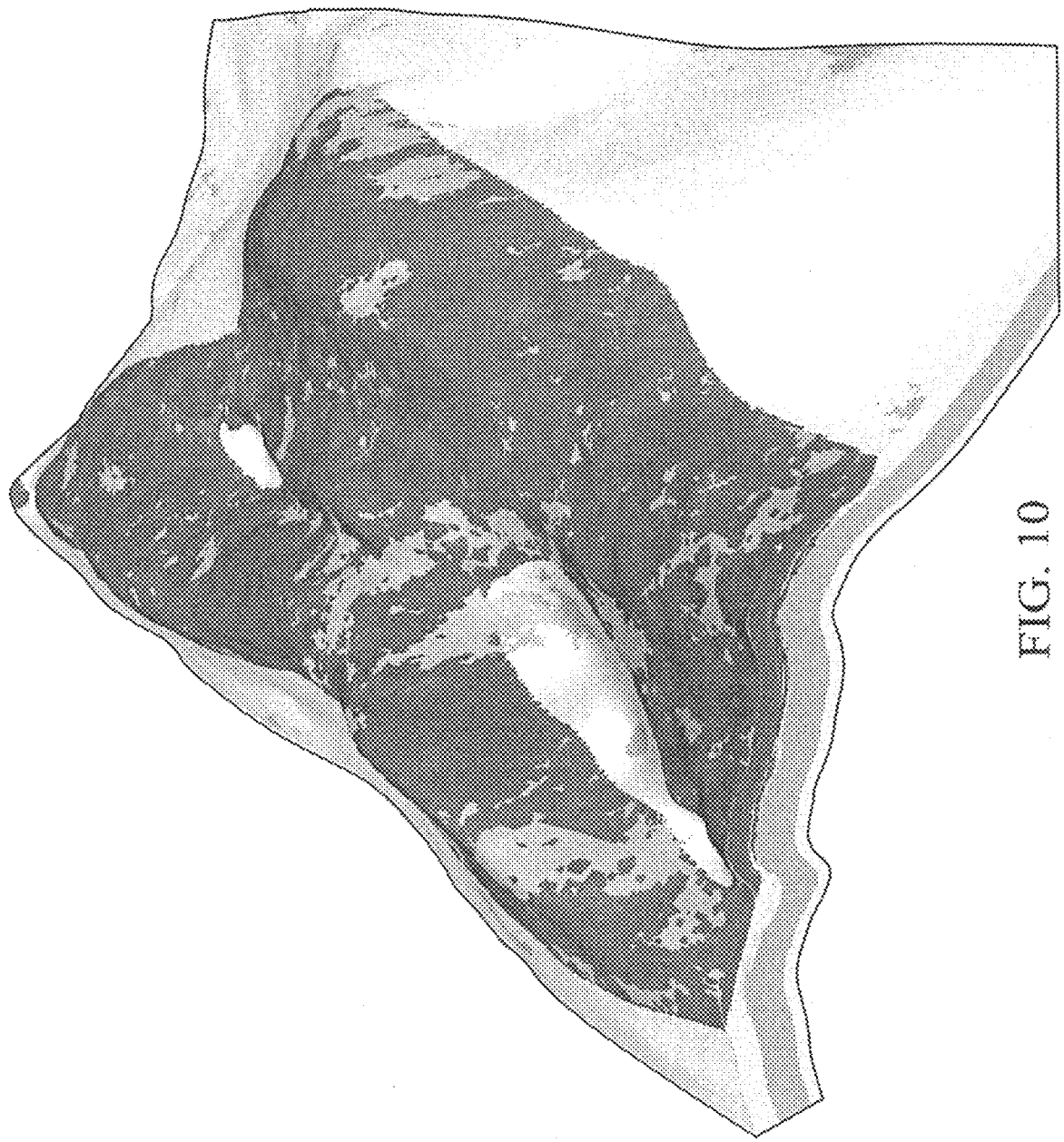
FIG. 10 is an isometric view of a computerized model of a subsurface reservoir structured grid reservoir simulation model for a test example of processing according to the present invention.
Figure 11:
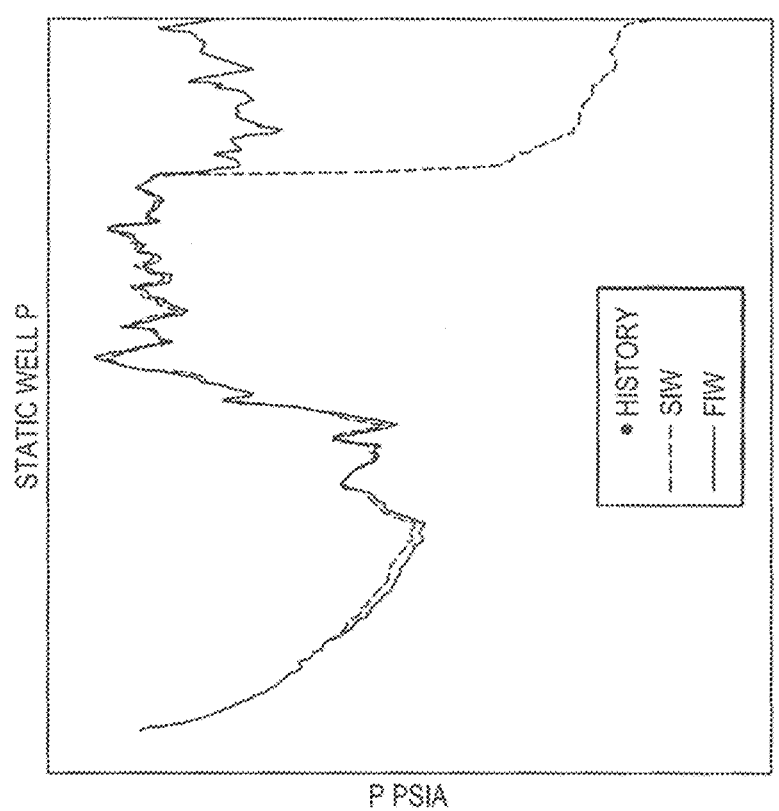
FIGS. 11, 12, 13 and 14 are comparison data plots of processing results according to the present invention against processing results according to the prior art for the model of FIG. 8.
Figure 12:
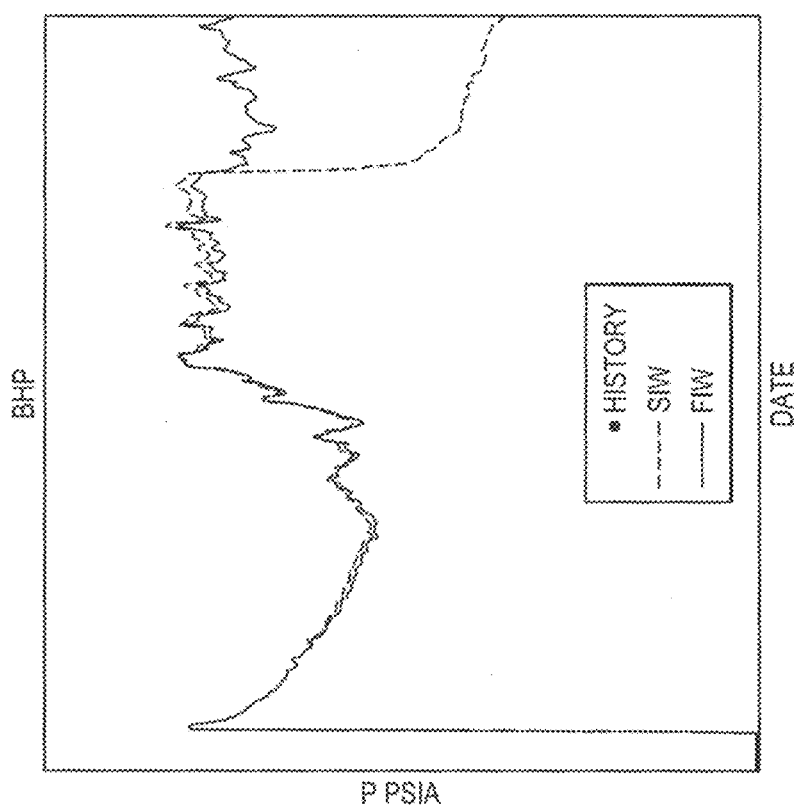
Figure 13:
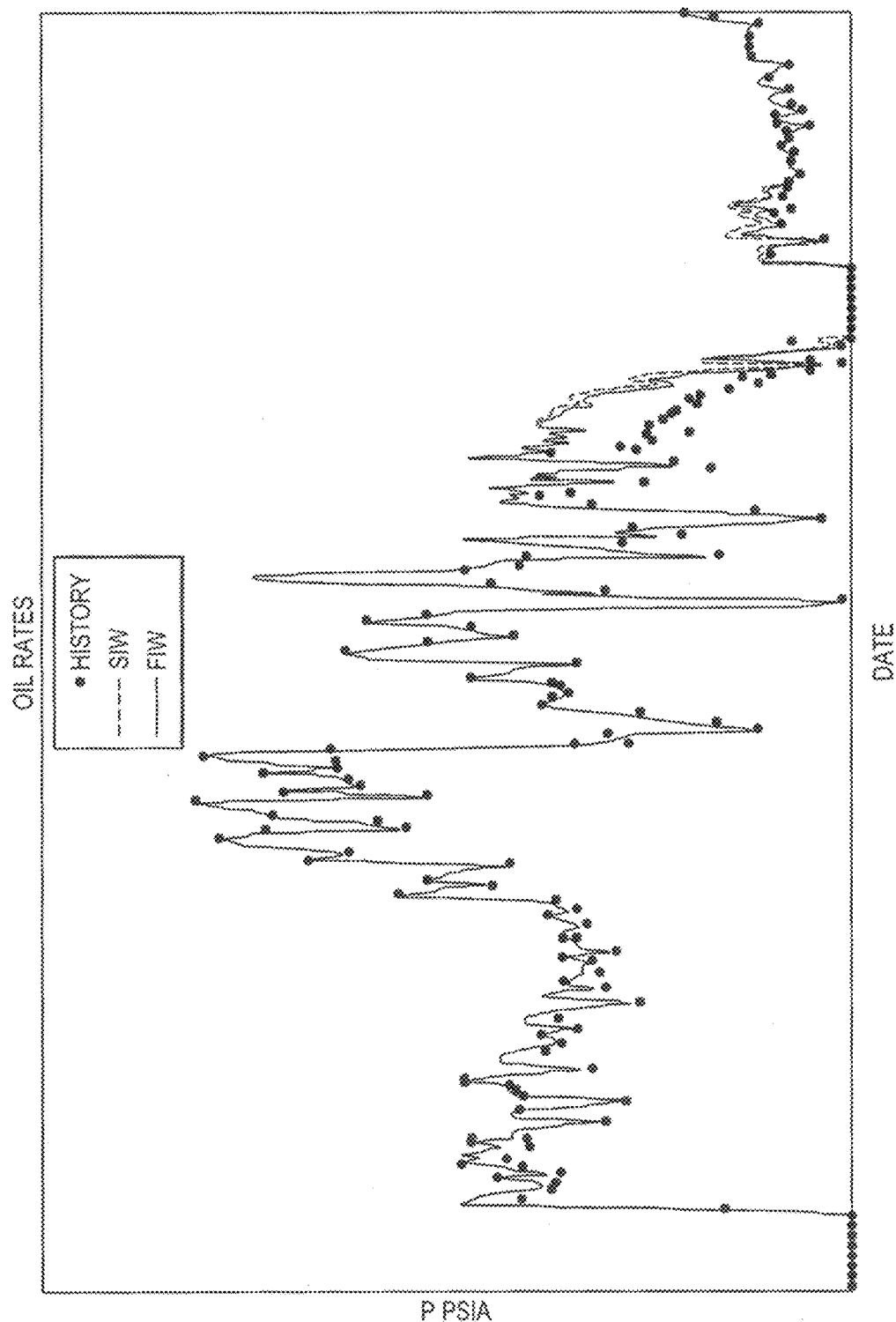
Figure 14:
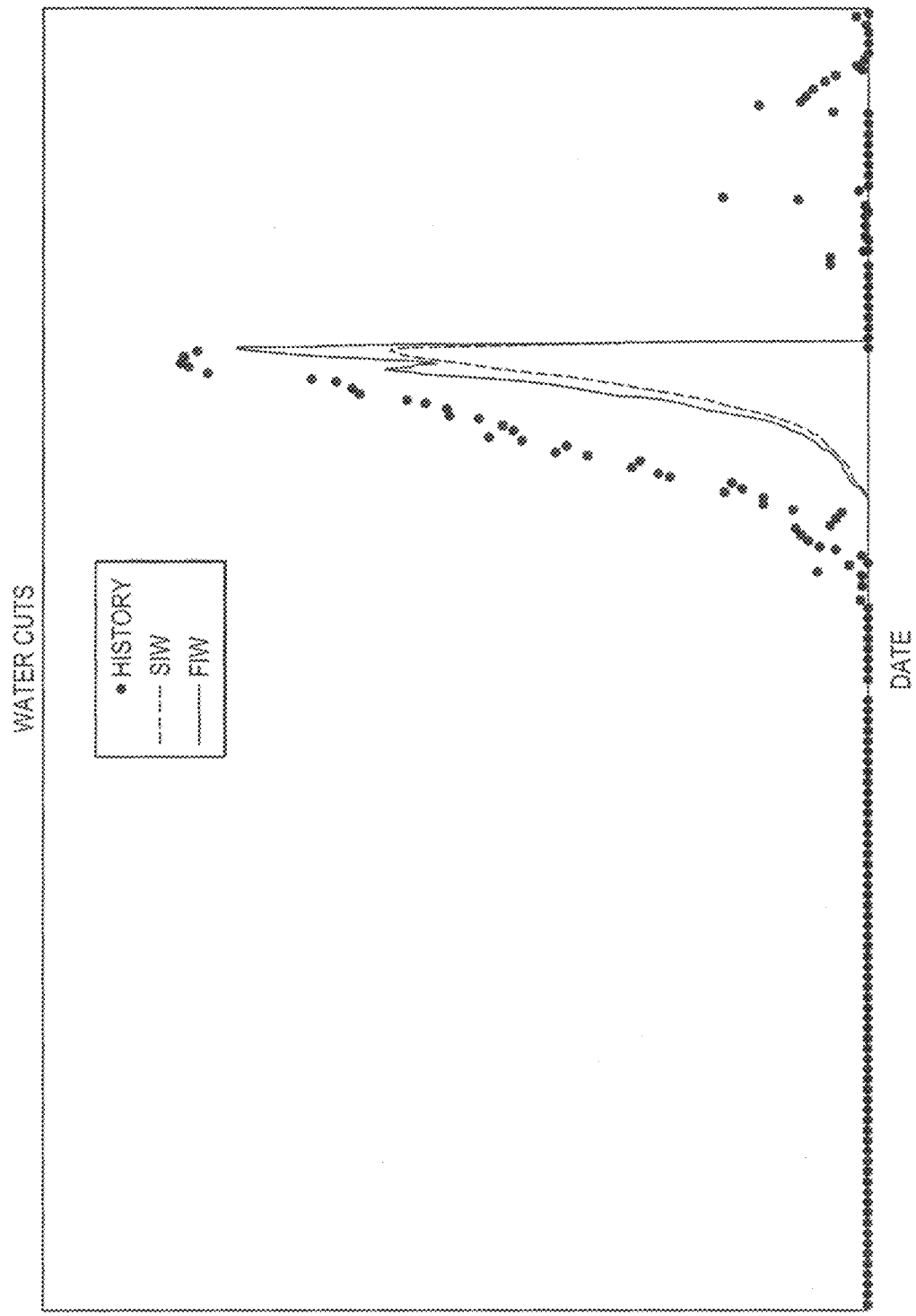

FIGS. 11, 12, 13 and 14 are comparative data plots of processing of the reservoir simulation model R shown in FIG. 10 according to the present invention against processing according to the prior Rowsum/Colsum preconditioning described above. The reservoir model was an 11.9 million grid-cell (399*607*49), three-phase, black-oil reservoir model with 2,095 wells. FIG. 11 illustrates comparative results of static well pressure over time, FIG. 12 illustrates comparative results of borehole pressure or BHP over time, and FIGS. 13 and 14 illustrate comparative results over time of oil rates and water cuts, respectively.

In FIGS. 11 through 14 it is shown that the fully-implicit well solution (FIW) produces expected static well pressure and borehole pressure value, whereas a prior-art method (SIW) did not give the correct values. Further, the fully-implicit well solution (FIW) and a prior art (SIW) produces comparable results for oil rates and water cuts for this particular well.

With the present invention, it is preferable to use the solver preconditioner by generating the [L][U] decomposition of [P] in the initial stage of the solve invocation. Whenever the inverse is needed during the solver preconditioning operations expressed in Equations (29), (42), or (54), a forward-backward substitution is used to generate the solution. Equations (30) through (33) are instances of the preconditioner Equation (29) where the number of series terms may be different for the matrices $E_R$ and $E_W$. The matrix-vector operations are done in a sequence from right to left as the computation and inter-process communication required to generate the required approximate solution vector.

From the foregoing, it can be seen that the present invention provides a methodology which handles the well influence coefficient matrix at comparable accuracy and robustness to those for the grid-to-grid flow terms. The method is highly parallelizable and runs faster than prior methods, as it requires fewer solver iterations to converge to the same tolerances.

The present invention provides parallel solution for fully-coupled fully-implicit wellbore modeling in reservoir simulation which is robust, and particularly applicable for complex wells with thousands of interaction terms with the reservoir grid cells. It is highly parallelizable and well suited for implementation in modern HPC hardware.

The invention has been sufficiently described so that a person with average knowledge in the field of reservoir modeling and simulation may reproduce and obtain the results mentioned in the invention herein. Nonetheless, any skilled person in the field of technique, subject of the invention herein, may carry out modifications not described in the request herein, to apply these modifications to a determined structure and methodology, or in the use and practice thereof, requires the claimed matter in the following claims; such structures and processes shall be covered within the scope of the invention.

It should be noted and understood that there can be improvements and modifications made of the present invention described in detail above without departing from the spirit or scope of the invention as set forth in the accompanying claims.

What is claimed is:

1. A method of simulating flow of multiphase fluids in wellbores of multilateral wells, the method comprising the steps of:
　partitioning a reservoir into a plurality of reservoir grid cells;
　partitioning each multilateral wellbore of a plurality multilateral wellbores into a plurality of wellbore cells;
　determining a plurality of sub-domains, each of the sub-domains comprising a subset of the reservoir grid cells;
　determining, for the reservoir grid cells, state changes and pressures of the reservoir grid cells and flow interchange of the multiphase fluids with the wellbore cells;
　determining, for the wellbore cells, flow interchange within the wellbore cells and flow interchange of the multiphase fluids with the reservoir grid cells;
　determining, for each of the multilateral wellbores, a multilateral wellbore dataset comprising:
　　well segment internal data corresponding to wellbore cells associated with the multilateral wellbore; and
　　for each sub-domain intersected by a segment of the multilateral wellbore, well-to-grid data comprising matrix data representing flow interchange between wellbore cells associated with the segment of the multilateral wellbore and reservoir grid cells of the sub-domain intersected;
　determining, for each of the sub-domains, a sub-domain dataset comprising:
　　grid cell internal data corresponding to the reservoir grid cells associated with the sub-domain;
　　for each segment of a multilateral wellbore intersecting the sub-domain, grid-to-well data comprising matrix data representing flow interchange between the reservoir grid cells of the sub-domain and wellbore cells associated with the segment of the multilateral wellbore intersected; and
　　for each other sub-domain of the plurality of sub-domains that is adjacent the sub-domain, grid-to-grid data comprising matrix data representing flow interchange between the reservoir grid cells of the sub-domain and reservoir grid cells of the other sub-domain adjacent the sub-domain;
　providing each of the multilateral wellbore datasets to different processors of a parallel processing system, wherein each of the multilateral wellbore datasets is provided to a respective processor of the parallel processing system that is different from the processor each of the other multilateral wellbore datasets is provided to, the providing of each of the multilateral wellbore datasets to different processors of the parallel processing system comprising:
　　providing, to a first processor of the parallel processing system associated with a first multilateral wellbore of the multilateral wellbores having segments intersecting a first sub-domain of the sub-domains, a first multilateral wellbore dataset comprising first well-to-grid data comprising matrix data representing flow interchange between wellbore cells associated with the segment of the first multilateral wellbore and reservoir grid cells of the first sub-domain;
　providing each of the sub-domain datasets to different processors of the parallel processing system, wherein each of the sub-domain datasets is provided to a respective processor of the parallel processing system that is different from the processor each of the other sub-domain datasets is provided to, the providing of each of the sub-domain datasets to different processors of the parallel processing system comprising:
　　providing, to a second processor of the parallel processing system associated with the first sub-domain, a first sub-domain dataset comprising first grid-to-well data comprising matrix data representing flow interchange between the reservoir grid cells of the first sub-domain and wellbore cells associated with the segment of the first multilateral wellbore, and first grid-to-grid data comprising matrix data representing flow interchange between the reservoir grid cells of the first sub-domain and reservoir grid cells of a second sub-domain; and
　　providing, to a third processor of the parallel processing system associated with the second sub-domain, second grid-to-grid data comprising matrix data representing the flow interchange between the reservoir grid cells of the first sub-domain and reservoir grid cells of the second sub-domain; and
　conducting, by the processors of the parallel processing system, parallel processing of the multilateral wellbore datasets and the sub-domain datasets to generate a simulation of representations of flow of the multiphase fluids of the wellbore in the reservoir, the parallel processing comprising:
　　exchanging, by the processors of the parallel processing system, well-to-grid data of the multilateral wellbore datasets, grid-to-well data of the sub-domain datasets, and grid-to-grid data of the sub-domain datasets, the exchanging comprising:
　　　the first processor and the second processor exchanging the first well-to-grid data and the first grid-to-well data; and
　　　the second processor and the third processor exchanging the first grid-to-grid data and the second grid-to-grid data;
　　forming, based on the exchange of well-to-grid data of the multilateral wellbore datasets, grid-to-well data of the sub-domain datasets, and grid-to-grid data of the sub-domain datasets by the processors of the parallel processing system, a series preconditioner as a series based expansion by matrix-vector multiplication operations of well influence terms based on the established representations of flow interchange with the wellbore cells for the reservoir grid cells and the established representations of flow interchange with the reservoir grid cells for wellbore cells having flow interchange;
　　applying a conjugate residual interactive matrix solution in the computer to solve the representations of flow of the multiphase fluids in the reservoir grid cells and wellbore cells to obtain a solution vector;
　　repeating the steps of forming a series preconditioner by matrix-vector multiplication operations and applying a conjugate residual interactive matrix solution in the computer to solve for the representations of flow of the multiphase fluids of the wellbore cells until the obtained solution vector is within an established limit of accuracy;
　　determining that the obtained residual is within the established limit of accuracy;
　　in response to determining that the obtained residual is within the established limit of accuracy:
　　　storing the simulation of representations of flow of the multiphase fluids of the wellbore cells; and displaying the simulation of representations of flow of the multiphase fluids of the wellbore in the reservoir, determining, based on the simulation of representations of flow of the multiphase fluids of the wellbore in the reservoir, a location of a well to be drilled; and drilling, based on the determination of the location of the well to be drilled, the well at the location determined.

* * * * *